US012342607B2

(12) United States Patent
Mitsuzuka et al.

(10) Patent No.: US 12,342,607 B2
(45) Date of Patent: Jun. 24, 2025

(54) SEMICONDUCTOR DEVICE

(71) Applicant: FUJI ELECTRIC CO., LTD., Kanagawa (JP)

(72) Inventors: Kaname Mitsuzuka, Matsumoto (JP); Tohru Shirakawa, Matsumoto (JP); Toru Ajiki, Matsumoto (JP); Yuichi Onozawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 268 days.

(21) Appl. No.: 16/794,208

(22) Filed: Feb. 18, 2020

(65) Prior Publication Data
US 2020/0335497 A1 Oct. 22, 2020

(30) Foreign Application Priority Data

Apr. 16, 2019 (JP) .................................. 2019-077819

(51) Int. Cl.
*H10D 84/60* (2025.01)
*H10D 8/00* (2025.01)
(Continued)

(52) U.S. Cl.
CPC .......... *H10D 84/617* (2025.01); *H10D 8/422* (2025.01); *H10D 12/481* (2025.01); *H10D 62/393* (2025.01); *H10D 64/117* (2025.01)

(58) Field of Classification Search
CPC ............. H01L 29/7395; H01L 29/7396; H01L 29/7397; H01L 29/7804; H01L 29/7805; H01L 29/7806; H01L 29/7803
See application file for complete search history.

(56) References Cited

U.S. PATENT DOCUMENTS 10,056,450 B2   8/2018  Kouno
10,141,304 B2  11/2018  Iwasaki
(Continued)

FOREIGN PATENT DOCUMENTS

CN  103069571 A  4/2013
CN  105830217 A  8/2016
(Continued)

OTHER PUBLICATIONS

Office Action issued for counterpart Japanese Application No. 2019-077819, issued by the Japanese Patent Office on Apr. 4, 2023 (drafted on Mar. 28, 2023).
(Continued)

*Primary Examiner* — Jesse Y Miyoshi

(57) ABSTRACT

A semiconductor device includes a transistor portion which includes a plurality of gate structure portions, and a diode portion which includes a cathode region in a lower surface of a semiconductor substrate. Each of the gate structure portions includes a gate trench portion, an emitter region of a first conductive type which is provided between an upper surface of the semiconductor substrate and a drift region to abut on the gate trench portion, and a base region of a second conductive type which is provided between the emitter region and the drift region to abut on the gate trench portion. A first threshold of the gate structure portion with a shortest distance to the cathode region in a top view is lower than a second threshold of the gate structure portion with a longest distance to the cathode region by 0.1 V or more and 1 V or less.

17 Claims, 15 Drawing Sheets

(51) Int. Cl.
    *H10D 12/00*     (2025.01)
    *H10D 62/17*     (2025.01)
    *H10D 64/00*     (2025.01)

(56) References Cited

U.S. PATENT DOCUMENTS

| | | | |
|---|---|---|---|
| 10,170,606 | B2 | 1/2019 | Shinsho |
| 10,256,234 | B2 | 4/2019 | Tanabe |
| 2012/0132955 | A1 | 5/2012 | Saito |
| 2013/0140586 | A1 | 6/2013 | Takahashi |
| 2016/0329323 | A1* | 11/2016 | Iwasaki ............... H01L 27/0727 |
| 2017/0236908 | A1* | 8/2017 | Naito ................ H01L 29/4238 |
| | | | 257/48 |
| 2018/0190649 | A1* | 7/2018 | Laven ................ H01L 29/0834 |
| 2018/0190650 | A1 | 7/2018 | Laven |
| 2018/0226400 | A1 | 8/2018 | Shinsho |
| 2019/0097030 | A1 | 3/2019 | Miyata |
| 2019/0157264 | A1 | 5/2019 | Yoshida |

FOREIGN PATENT DOCUMENTS

| | | | |
|---|---|---|---|
| CN | 109314139 A | 2/2019 | |
| JP | 2011216825 A | 10/2011 | |
| JP | 2015118991 A | 6/2015 | |
| JP | 2015185742 A | 10/2015 | |
| JP | 2017041601 A | 2/2017 | |
| JP | 2018006648 A | 1/2018 | |
| JP | 2018120990 A | 8/2018 | |
| WO | 2018056233 A1 | 3/2018 | |
| WO | WO-2018151227 A1 * | 8/2018 | ....... H01L 21/26506 |

OTHER PUBLICATIONS

Office Action issued for counterpart Chinese Application 202010115605, issued by The State Intellectual Property Office of People's Republic of China on Jun. 7, 2024.

* cited by examiner

| ΔVth (V) | SNAPBACK SUPPRESSION | STABLE OPERATION |
|---|---|---|
| −0.05 | × | ○ |
| −0.1 | ○ | ○ |
| −0.2 | ○ | ○ |
| −0.3 | ○ | ○ |
| −0.4 | ○ | ○ |
| −0.5 | ○ | ○ |
| −0.6 | ○ | △ |
| −0.7 | ○ | △ |
| −0.8 | ○ | △ |
| −0.9 | ○ | △ |
| −1.0 | ○ | △ |
| −1.1 | ○ | × |
| −1.2 | ○ | × |

*FIG. 12*

SEMICONDUCTOR DEVICE

The contents of the following Japanese patent application are incorporated herein by reference:
NO. 2019-077819 filed in JP on Apr. 16, 2019.

BACKGROUND

1. Technical Field

The present invention relates to a semiconductor device.

2. Related Art

Conventionally, there is known a semiconductor device in which a transistor such as an insulated gate bipolar transistor (IGBT) and a diode such as a freewheeling diode (FWD) are provided in the same substrate (for example, see Patent Literatures 1 to 6).

CITATION LIST

Patent Literature

Patent Literature 1: Japanese Unexamined Patent Publication No. 2017-416011
Patent Literature 2: Japanese Unexamined Patent Publication No. 2011-216825
Patent Literature 3: Japanese Unexamined Patent Publication No. 2015-118991
Patent Literature 4: Japanese Unexamined Patent Publication No. 2015-185742
Patent Literature 5: Japanese Unexamined Patent Publication No. 2018-6648
Patent Literature 6: Japanese Unexamined Patent Publication No. 2018-120990

GENERAL DISCLOSURE

In the semiconductor device, it is desirable that a dynamic characteristic such as a snapback phenomenon is improved.

In order to solve the above problem, there is provided a semiconductor device which includes a semiconductor substrate which includes a drift region of a first conductive type. The semiconductor device may include a transistor portion which includes a plurality of gate structure portions in an upper surface of the semiconductor substrate. The semiconductor device may include a diode portion which includes a cathode region of the first conductive type, which has a higher doping concentration than the drift region, in a lower surface of the semiconductor substrate. Each of the gate structure portions may include a gate trench portion which is provided to reach the drift region from the upper surface of the semiconductor substrate. Each of the gate structure portions may include an emitter region of the first conductive type which is provided between the upper surface of the semiconductor substrate and the drift region to abut on the gate trench portion and has a higher doping concentration than the drift region. Each of the gate structure portions may include a base region of a second conductive type which is provided between the emitter region and the drift region to abut on the gate trench portion. A first threshold of the gate structure portion with a shortest distance to the cathode region in a top view may be lower than a second threshold of the gate structure portion with a longest distance to the cathode region by 0.1 V or more and 1 V or less.

The gate structure portion having the first threshold may be provided in parallel with an end side of the cathode region in a top view.

The gate trench portion may be provided to include a longitudinal side in a direction parallel with the end side of the cathode region. The transistor portion may include the gate structure portion, and include a plurality of gate mesa portions provided along the longitudinal side of the gate trench portion. The gate structure portion having the first threshold may be provided in the gate mesa portion with a shortest distance to the cathode region among the plurality of gate mesa portions.

The gate trench portion may include a gate conductive portion. The gate trench portion may include a gate dielectric film which is provided between the gate conductive portion and the semiconductor substrate. A film thickness of the gate dielectric film in the gate trench portion of the gate structure portion having the first threshold may be smaller than a film thickness of the gate dielectric film in the gate trench portion of the gate structure portion having the second threshold.

The doping concentration of the base region of the gate structure portion having the first threshold may be lower than the doping concentration of the base region of the gate structure portion having the second threshold.

A channel density of the gate mesa portion having the first threshold may be higher than the channel density of the gate mesa portion having the second threshold.

The gate mesa portion may include an emitter region and a contact region of the second conductive type, which has a higher doping concentration than the base region, in the upper surface of the semiconductor substrate. An area ratio of the contact region to the emitter region in the upper surface of the gate mesa portion having the first threshold may be smaller than an area ratio of the contact region to the emitter region in the upper surface of the gate mesa portion having the second threshold.

The transistor portion may include the gate trench portion and a dummy trench portion. The density of the dummy trench portion in a proximity region of the transistor portion abutting on the cathode region in a top view may be smaller than the density of the dummy trench portion in a center region in a region with a longest distance to the cathode region. The gate structure portion having the first threshold may be provided in the proximity region.

The diode portion may include an upper surface side lifetime control region, which has a shorter carrier lifetime than the other regions, on the upper surface side of the semiconductor substrate. The upper surface side lifetime control region may be provided to extend to the proximity region of the transistor portion abutting on the cathode region in a top view. The gate structure portion having the first threshold may be provided in the proximity region.

The cathode region may have a long side in a top view. The gate structure portion having the first threshold is provided at a position facing the center of the long side of the cathode region, and may be not provided at a position facing either end of the long side. The gate trench portion may intersect with the long side of the cathode region in a top view.

The semiconductor device may include an interlayer dielectric film which is provided on an upper side of the upper surface of the semiconductor substrate, and includes a contact hole. The semiconductor device may include an emitter electrode which is provided on an upper side of the interlayer dielectric film, and abuts on the semiconductor substrate through the contact hole. The gate trench portion may extend in a predetermined extending direction in the upper surface of the semiconductor substrate. The contact hole having a longitudinal side in a direction different from the extending direction may be disposed between the gate structure portion having the first threshold and the end side of the semiconductor substrate in the extending direction.

The first threshold may be lower than the second threshold by 0.1 V or more and 0.5 V or less.

The summary clause does not necessarily describe all necessary features of the embodiments of the present invention. The present invention may also be a sub-combination of the features described above.

BRIEF DESCRIPTION OF THE DRAWINGS

FIG. 12 is a diagram illustrating a relation between the drop amount ΔVth of the threshold voltage in the first gate structure portion 46-1 and a dynamic characteristic of the semiconductor device 100.

DESCRIPTION OF EXEMPLARY EMBODIMENTS

Figure 1:
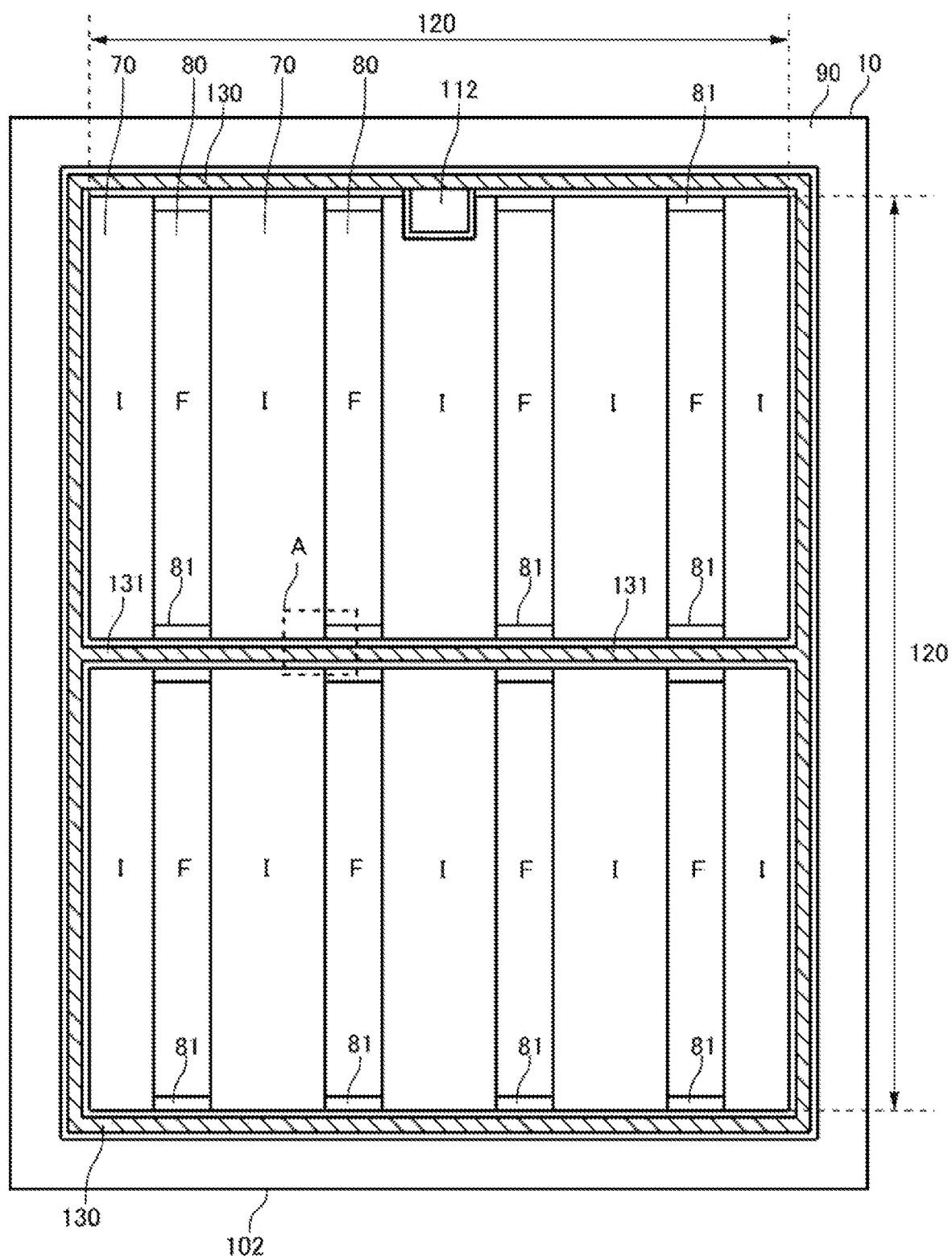
FIG. 1 is a top view illustrating an example of a semiconductor device 100 according to an embodiment of the invention.

Hereinbelow, the invention will be described through embodiments thereof, but the following embodiments do not limit the invention disclosed in claims. In addition, not all the combinations of features described in the embodiments are essential for the solution of the invention.

In this specification, one side in a direction parallel with a depth direction of a semiconductor substrate is referred to as "upper" and the other side is referred to as "lower". One of two main surfaces of a substrate, a layer, or other members is referred to as an upper surface, and the other surface is referred to as a lower surface. The "upper" and "lower" directions are not limited to the directions of gravity or the directions at the time of mounting a semiconductor device.

In this specification, technical matters may be described using a Cartesian coordinate axis of an X axis, a Y axis, and a Z axis. The Cartesian coordinate axis only specifies relational positions between components, but does not limit a specific direction. For example, the Z axis does not limit a height direction with respect to the ground. Further, a +Z axis direction and a −Z axis direction are directions opposite to each other. In a case where the Z axis direction is denoted without mentioning positive or negative, the direction means a direction parallel to the +Z axis and the −Z axis. In addition, in this specification, the viewing from the +Z axis direction may be referred to as a top view.

In a case where there is a mention such as "same" or "equal" in this specification, the mention may include an error which may be caused at the time of manufacturing. The error falls within 10% for example.

In this specification, the conductive type of a doping region doped with impurities is described as a P or N type. However, the conductive type of each doping region may be inversed in polarity. In addition, in a case where a P+ or N+ type is denoted in this specification, the corresponding type means a doping concentration higher than that of a P or N type. In a case where a P− or N− type is denoted, the corresponding type means a doping concentration lower than that of the P or N type. In addition, in a case where a P++ or N++ type is denoted in this specification, the corresponding type means a doping concentration higher than that of the P+ or N+ type.

The doping concentration in this specification indicates a concentration of impurities which are activated as a donor or an acceptor. In this specification, a concentration difference between the donor and the acceptor may be referred to as the doping concentration. The concentration difference can be measured by a voltage-capacitance measurement (CV method). In addition, a carrier concentration measured by a spread resistance measurement (SR) may be used as the doping concentration. In addition, in a case where a doping concentration distribution has a peak, the peak value may be used as the doping concentration in the region. In a case where the doping concentration in a region where the donor or the acceptor exists is almost even, an average value of the doping concentration may be used as the doping concentration in the region. In addition, in this specification, the concentration of a dopant indicates a concentration of each of the donor and the acceptor.

FIG. 1 is a top view illustrating an example of a semiconductor device 100 according to an embodiment of the invention. FIG. 1 illustrates positions to which each member is projected onto the upper surface of a semiconductor substrate 10. In FIG. 1, only some members of the semiconductor device 100 are illustrated, and the other members are omitted.

The semiconductor device 100 includes the semiconductor substrate 10. The semiconductor substrate 10 is a substrate which is formed of a semiconductor material such as silicon or a compound semiconductor. The semiconductor substrate 10 has an end side 102 in a top view. In a case where there is a mention simply saying "in a top view", it means a viewing from the upper surface side of the semiconductor substrate 10. The semiconductor substrate 10 of this example includes two sets of the end sides 102 facing each other in a top view. In FIG. 1, the X axis and the Y axis are parallel with any end side 102. In addition, the Z axis is perpendicular to the upper surface of the semiconductor substrate 10.

An active portion 120 is provided in the semiconductor substrate 10. The active portion 120 is a region, where the main current flows in the depth direction, between the upper surface and the lower surface of the semiconductor substrate 10 in a case where the semiconductor device 100 is controlled to the ON state. An emitter electrode is provided on an upper side of the active portion 120, while it is omitted in FIG. 1.

In the active portion 120, there are provided a transistor portion 70 which includes a transistor element such as an IGBT, and a diode portion 80 which includes a diode element such as an FWD. In FIG. 1, the region where the transistor portion 70 is disposed is attached with Symbol "I", and the region where the diode portion 80 is disposed is attached with Symbol "F". The transistor portion 70 and the diode portion 80 are disposed side by side along a predetermined arranging direction (the X axis direction in FIG. 1). The transistor portion 70 and the diode portion 80 may be disposed side by side alternately in the X axis direction. In this specification, a direction perpendicular to the arranging direction in a top view may be referred to as an extending direction (the Y axis direction in FIG. 1). The transistor portion 70 and the diode portion 80 each may include a longitudinal side in the extending direction. In other words, the length in the Y axis direction of the transistor portion 70 is larger than the width in the X axis direction. Similarly, the length in the Y axis direction of the diode portion 80 is larger than the width in the X axis direction. The longitudinal direction of the transistor portion 70 and the diode portion 80 and the longitudinal direction of a trench portion (described later) may be the same, or may be different.

The diode portion 80 includes an N+ cathode region in a region which abuts on the lower surface of the semiconductor substrate 10. In this specification, a region where the cathode region is provided is referred to as the diode portion 80. In other words, the diode portion 80 is a region which is overlapped with the cathode region in a top view. In the lower surface of the semiconductor substrate 10, a P+ collector region may be provided in a region other than the cathode region. In this specification, an extension region 81, which extends from the diode portion 80 to a gate runner (described later) in the Y axis direction, may be included in the diode portion 80. A collector region is provided in the lower surface of the extension region 81.

The semiconductor device 100 may include one or more pads on an upper side of the semiconductor substrate 10. The semiconductor device 100 of this example includes a gate pad 112. The semiconductor device 100 may include an anode pad, a cathode pad, and a current detection pad in addition to the gate pad 112. Each pad is disposed near the end side 102. The region near the end side 102 indicates a region between the end side 102 and the emitter electrode in a top view. At the time of mounting the semiconductor device 100, each pad may be connected to an external circuit through a wiring such as a wire.

A gate potential is applied to the gate pad 112. The gate pad 112 is electrically connected to a conductive portion of a gate trench portion of the active portion 120. The semiconductor device 100 includes a gate runner which connects the gate pad 112 and the gate trench portion. In FIG. 1, the gate runner is hatched with diagonal lines.

The gate runner of this example includes an outer peripheral gate runner 130 and an active side gate runner 131. The outer peripheral gate runner 130 is disposed between the active portion 120 and the end side 102 of the semiconductor substrate 10 in a top view. The outer peripheral gate runner 130 of this example surrounds the active portion 120 in a top view. The region surrounded by the outer peripheral gate runner 130 in a top view may be the active portion 120. In addition, the outer peripheral gate runner 130 is connected to the gate pad 112. The outer peripheral gate runner 130 is disposed on an upper side of the semiconductor substrate 10. The outer peripheral gate runner 130 may be a metallic wiring containing aluminum.

The active side gate runner 131 is provided in the active portion 120. With the active side gate runner 131 in the active portion 120, it is possible to reduce a variation in wiring length from the gate pad 112 to each region of the semiconductor substrate 10, that is, a variation in delaying and attenuation of a voltage to be applied to each region.

The active side gate runner 131 is connected to the gate trench portion of the active portion 120. The active side gate runner 131 is disposed on the upper side of the semiconductor substrate 10. The active side gate runner 131 may be a wiring which is formed of a semiconductor such as polysilicon doped with impurities.

The active side gate runner 131 may be connected to the outer peripheral gate runner 130. The active side gate runner 131 of this example is provided to extend in the X axis direction from one outer peripheral gate runner 130 to the other outer peripheral gate runner 130 at the substantially center of the Y axis direction so as to traverse the active portion 120.

In addition, the semiconductor device 100 may include a temperature sense portion (not illustrated) which is a PN junction diode formed of a material such as polysilicon, and a current detection portion (not illustrated) which simulates the operation of the transistor portion provided in the active portion 120.

The semiconductor device 100 of this example includes an edge termination structure 90 between the outer peripheral gate runner 130 and the end side 102. The edge termination structure 90 relaxes electric field concentration on the upper surface side of the semiconductor substrate 10. The edge termination structure 90 has a structure of, for example, a guard ring, a field plate, a RESURF, or a combination thereof. The structure of the guard ring, the field plate, the RESURF, or the combination thereof may be provided in a circular shape surrounding the active portion 120.

Figure 2:
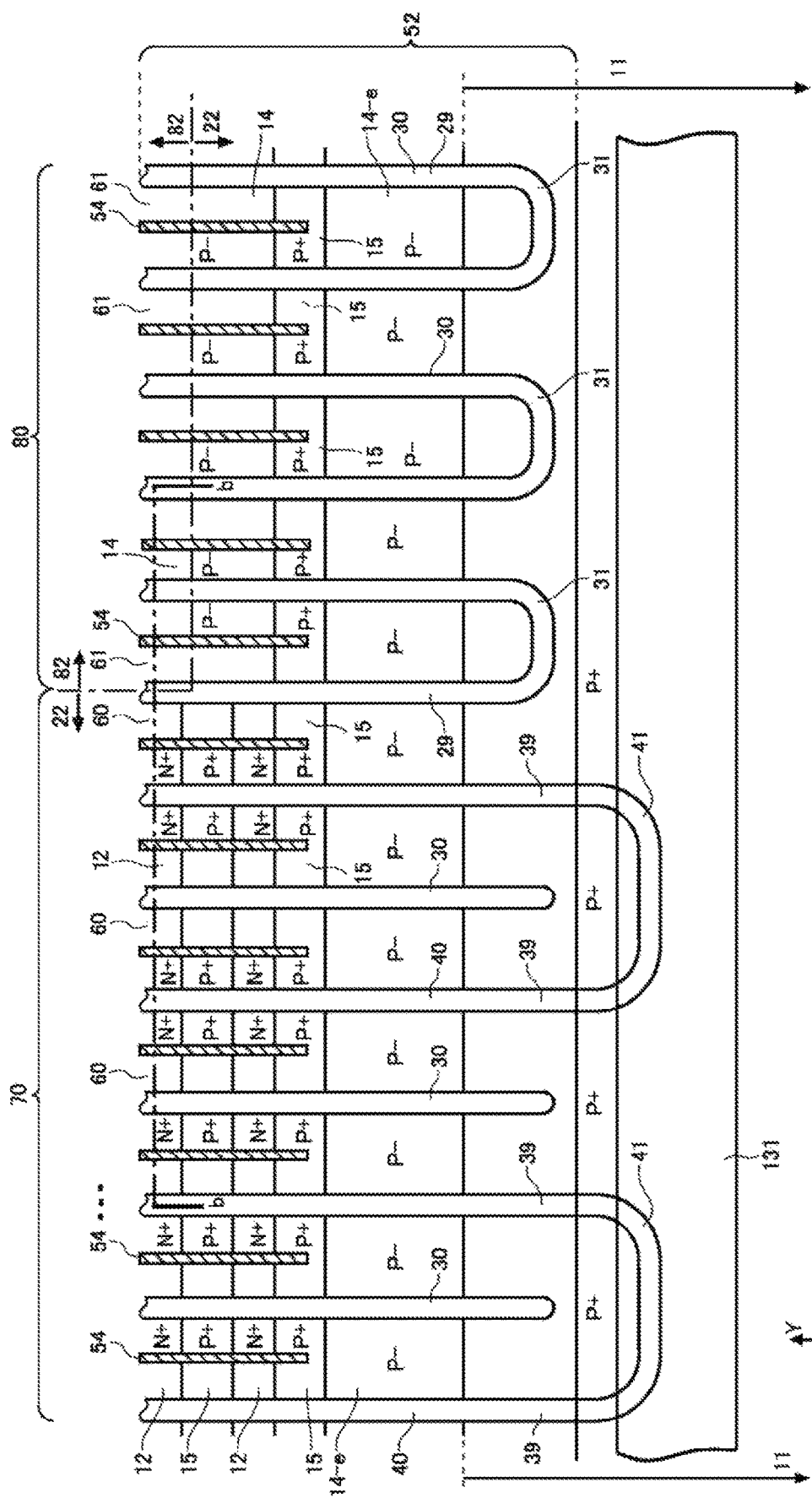
FIG. 2 is an enlarged view of Region A in FIG. 1.

FIG. 2 is an enlarged view of Region A in FIG. 1. Region A is a region which includes the transistor portion 70, the diode portion 80, and the active side gate runner 131. In the region where the active portion 120 and the outer peripheral gate runner 130 are adjacent, the outer peripheral gate runner 130 may be disposed instead of the active side gate runner 131.

The semiconductor device 100 of this example includes a gate trench portion 40, a dummy trench portion 30, a well region 11, an emitter region 12, a base region 14, and a contact region 15. The gate trench portion 40, the dummy trench portion 30, the well region 11, the emitter region 12, the base region 14, and the contact region 15 are provided inside on the upper surface side of the semiconductor substrate 10. The gate trench portion 40 and the dummy trench portion 30 each are an example of the trench portion. In addition, the semiconductor device 100 of this example includes an emitter electrode 52 and the active side gate runner 131. The emitter electrode 52 and the active side gate runner 131 are provided on an upper side of the upper surface of the semiconductor substrate 10. The emitter electrode 52 and the active side gate runner 131 are provided to be separated from each other.

An interlayer dielectric film is provided between the emitter electrode 52 and the upper surface of the semiconductor substrate 10, and between the active side gate runner 131 and the upper surface of the semiconductor substrate 10, while it is omitted in FIG. 2. In the interlayer dielectric film of this example, a contact hole 54 is provided to pass through the interlayer dielectric film. In FIG. 2, each contact hole 54 is hatched with diagonal lines.

The emitter electrode 52 is provided on an upper side of the gate trench portion 40, the dummy trench portion 30, the well region 11, the emitter region 12, the base region 14, and the contact region 15. The emitter electrode 52 comes into contact with the emitter region 12, the contact region 15, and the base region 14 in the upper surface of the semiconductor substrate 10 through the contact hole 54. In addition, the emitter electrode 52 is connected to a dummy conductive portion in the dummy trench portion 30 through the contact hole which is provided in the interlayer dielectric film. The emitter electrode 52 may be connected to the dummy conductive portion of the dummy trench portion 30 at the edge of the dummy trench portion 30 in the Y axis direction.

The active side gate runner 131 is connected to the gate trench portion 40 through the contact hole provided in the interlayer dielectric film. The active side gate runner 131 may be connected to a gate conductive portion of the gate trench portion 40 in an edge portion 41 of the gate trench portion 40 in the Y axis direction. The active side gate runner 131 is not connected to the dummy conductive portion in the dummy trench portion 30.

The emitter electrode 52 is formed of a material containing metal. FIG. 2 illustrates a range where the emitter electrode 52 is provided. For example, at least a part of the region of the emitter electrode 52 is formed of aluminum or an aluminum-silicon alloy. The emitter electrode 52 may include a barrier metal, which is formed of titanium or a titanium compound, in the lower layer of the region formed of aluminum. Further, in the contact hole, there may be included a plug which is formed by being filled with a material such as tungsten so as to abut on the barrier metal and a material such as aluminum.

The well region 11 is provided to be overlapped with the active side gate runner 131. The well region 11 is provided to extend with a predetermined width even in a range where the well region is not overlapped with the active side gate runner 131. The well region 11 of this example is provided to be separated from the end of the Y axis direction of the contact hole 54 toward the active side gate runner 131. The well region 11 is a region of the second conductive type which has a higher doping concentration than the base region 14. The base region 14 of this example is a P− type, and the well region 11 is a P+ type.

Each of the transistor portion 70 and the diode portion 80 includes a plurality of trench portions which are arranged in the arranging direction. In the transistor portion 70 of this example, one or more gate trench portions 40 and one or more dummy trench portions 30 are alternately provided along the arranging direction. In the diode portion 80 of this example, a plurality of dummy trench portions 30 is provided along the arranging direction. In the diode portion 80 of this example, the gate trench portion 40 is not provided.

The gate trench portion 40 of this example may include two straight portions 39 (trench portions of a straight shape along the extending direction) extending along the extending direction perpendicular to the arranging direction, and the edge portion 41 which connects the two straight portions 39. The extending direction in FIG. 2 is the Y axis direction.

At least a part of the edge portion 41 is desirably provided in a curved shape in a top view. The electric field concentration on the end portion of the straight portion 39 can be relaxed by connecting the end portions in the Y axis direction of the two straight portion 39 using the edge portion 41.

In the transistor portion 70, the dummy trench portion 30 is provided between the straight portions 39 of the gate trench portion 40. One dummy trench portion 30 may be provided between the straight portions 39, or the plurality of dummy trench portions 30 may be provided. The dummy trench portion 30 may be in a straight shape extending in the extending direction, or may include a straight portion 29 and an edge portion 31 similarly to the gate trench portion 40. The semiconductor device 100 illustrated in FIG. 2 includes the dummy trench portion 30 of a straight shape having no edge portion 31, and the dummy trench portion 30 having the edge portion 31. In this specification, each straight portion of each trench portion may be referred to as one trench portion.

A diffusion depth of the well region 11 may be deeper than those of the gate trench portion 40 and the dummy trench portion 30. The end portions of the Y axis direction of the gate trench portion 40 and the dummy trench portion 30 are provided in the well region 11 in a top view. In other words, the bottom portion in the depth direction of each trench portion is covered by the well region 11 in the end portion of the Y axis direction of each trench portion. With this configuration, it is possible to relax the electric field concentration on the bottom portion of each trench portion.

A mesa portion is provided between the trench portions in the arranging direction. The mesa portion indicates a region which is interposed by the trench portions in the semiconductor substrate 10. As an example, the upper end of the mesa portion is the upper surface of the semiconductor substrate 10. The depth position of the lower end of the mesa portion is the same as that of the lower end of the trench portion. The mesa portion of this example is provided to extend in the extending direction (Y axis direction) along the trench portion in the upper surface of the semiconductor substrate 10. In this example, a mesa portion 60 is provided in the transistor portion 70, and a mesa portion 61 is provided in the diode portion 80. In the case of simply referring the mesa portion in this specification, the mesa portion indicates each of the mesa portion 60 and the mesa portion 61.

Among the mesa portions 60, the mesa portion 60 which abuts on the gate trench portion 40 and is provided with the emitter region 12 is referred to as a gate mesa portion. In this example, all the mesa portions 60 of the transistor portion 70 are the gate mesa portion. In other examples, the transistor portion 70 may include a dummy mesa portion which does not abut on the gate trench portion 40, or is not provided with the emitter region 12.

In each mesa portion, the base region 14 is provided. In the base region 14 exposed to the upper surface of the semiconductor substrate 10 in the mesa portion, a region disposed closest to the active side gate runner 131 is referred to as a base region 14-e. In FIG. 2, the base region 14-e disposed in one end portion in the extending direction of each mesa portion is illustrated, and the other end portion of each mesa portion is also disposed with the base region 14-e. In each mesa portion, at least one of the emitter region 12 of the first conductive type and the contact region 15 of the second conductive type may be provided in a region interposed by the base regions 14-e in a top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 includes the emitter region 12 which is exposed to the upper surface of the semiconductor substrate 10. The emitter region 12 is provided to abut on the gate trench portion 40. The mesa portion 60 abutting on the gate trench portion 40 may be provided with the contact region 15 which is exposed to the upper surface of the semiconductor substrate 10.

Each of the contact region 15 and the emitter region 12 in the mesa portion 60 is provided from one trench portion in the X axis direction to the other trench portion. As an example, the contact region 15 and the emitter region 12 of the mesa portion 60 are alternately disposed along the extending direction (Y axis direction) of the trench portion.

As another example, the contact region 15 and the emitter region 12 of the mesa portion 60 may be provided in a stripe shape along the extending direction (Y axis direction) of the trench portion. For example, the emitter region 12 is provided in the region abutting on the trench portion, and the contact region 15 is provided in the region interposed by the emitter region 12.

The emitter region 12 is not provided in the mesa portion 61 of the diode portion 80. The base region 14 and the contact region 15 may be provided in the upper surface of the mesa portion 61. The contact region 15 may be provided in the region, which is interposed by the base region 14-e in the upper surface of the mesa portion 61, to abut on each base region 14-e. The base region 14 may be provided in the region which is interposed by the contact region 15 in the upper surface of the mesa portion 61. The base region 14 may be disposed in the entire region interposed by the contact region 15.

In the transistor portion 70, a buffer region may be provided in the region abutting on the diode portion 80. The mesa portion of the buffer region is a dummy mesa portion which has the same structure as that of the mesa portion 61 of the diode portion 80. However, a collector region 22 is provided in the lower surface of the dummy mesa portion of the buffer region. With the buffer region, the cathode region 82 and the gate mesa portion can be disposed to be separated, and the flowing of carriers between the gate mesa portion and the cathode region 82 can be suppressed.

The mesa portion of the buffer region may include the contact region 15 in the upper surface of the semiconductor substrate 10 instead of at least a part of the base region 14 of the diode portion 80. The mesa portion of the buffer region may be configured such that the area of the contact region 15 in the upper surface is larger than that of the contact region 15 in the upper surface of one mesa portion 60. With this configuration, the carriers such as holes are easily extracted toward the emitter electrode 52 when the transistor portion 70 is turned off.

The contact hole 54 is provided on an upper side of each mesa portion. The contact hole 54 is disposed in the region interposed by the base region 14-e. The contact hole 54 of this example is provided on an upper side of each of the contact region 15, the base region 14, and the emitter region 12. The contact hole 54 is not provided in the region corresponding to the base region 14-e and the well region 11. The contact hole 54 may be disposed in the center in the arranging direction (X axis direction) of the mesa portion 60.

In the diode portion 80, an N+ cathode region 82 is provided in a region which is in direct contact with the lower surface of the semiconductor substrate 10. In the lower surface of the semiconductor substrate 10, a P+ collector region 22 may be provided in a region where the cathode region 82 is not provided. In FIG. 2, the boundary between the cathode region 82 and the collector region 22 is illustrated with a dotted line.

Figure 3:
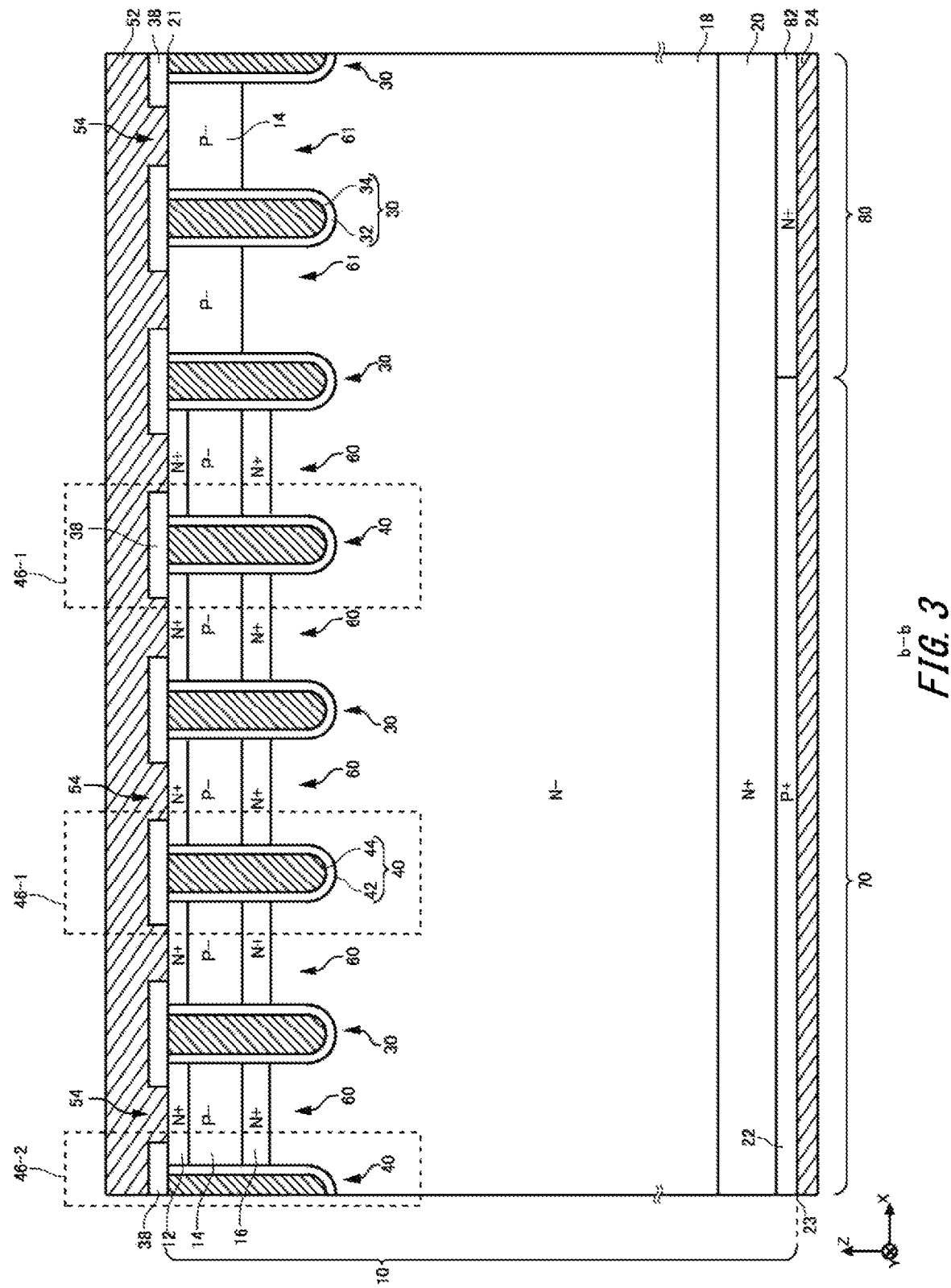
FIG. 3 is a diagram illustrating an example of a cross section taken along line b-b in FIG. 2.

FIG. 3 is a diagram illustrating a cross section taken along line b-b in FIG. 2. The b-b cross section is an XZ plane passing through the emitter region 12 and the cathode region 82. The semiconductor device 100 of this example includes the semiconductor substrate 10, an interlayer dielectric film 38, the emitter electrode 52, and a collector electrode 24 in the cross section. The interlayer dielectric film 38 is provided in the upper surface of the semiconductor substrate 10. The interlayer dielectric film 38 is a film which includes at least one layer of a dielectric film such as silicate glass added with impurities such as boron or phosphorus, a thermal oxide film, and other dielectric films. In the interlayer dielectric film 38, the contact hole 54 described in FIG. 2 is provided.

The emitter electrode 52 is provided on an upper side of the interlayer dielectric film 38. The emitter electrode 52 comes into contact with an upper surface 21 of the semiconductor substrate 10 through the contact hole 54 of the interlayer dielectric film 38. The collector electrode 24 is provided in the lower surface 23 of the semiconductor substrate 10. The emitter electrode 52 and the collector electrode 24 are formed of a metal material such as aluminum. In this specification, a direction (Z axis direction) connecting the emitter electrode 52 and the collector electrode 24 is referred to as a depth direction.

The semiconductor substrate 10 includes an N− drift region 18. The drift region 18 is provided in each of the transistor portion 70 and the diode portion 80.

In the mesa portion 60 of the transistor portion 70, the N+ emitter region 12 and the P− base region 14 are provided sequentially from the upper surface 21 side of the semiconductor substrate 10. The drift region 18 is provided below the base region 14. In the mesa portion 60, an N+ accumulation region 16 may be provided. The accumulation region 16 is disposed between the base region 14 and the drift region 18.

The emitter region 12 is disposed between the upper surface 21 of the semiconductor substrate 10 and the drift region 18. The emitter region 12 is exposed to the upper surface 21 of the semiconductor substrate 10, and is provided to abut on the gate trench portion 40. The emitter region 12 may abut on the trench portions on both sides of the mesa portion 60. The emitter region 12 has a higher doping concentration than the drift region 18.

The base region 14 is provided between the emitter region 12 and the drift region 18. The base region 14 of this example is provided to abut on the emitter region 12. The base region 14 may abut on the trench portions on both sides of the mesa portion 60.

The accumulation region 16 is provided below the base region 14. The accumulation region 16 has a higher doping concentration than the drift region 18. With a highly-concentrated accumulation region 16 between the drift region 18 and the base region 14, a carrier injection-enhancement effect (IE effect) is increased, so that an ON voltage can be reduced. The accumulation region 16 may be provided to cover the entire lower surface of the base region 14 in each mesa portion 60.

In the mesa portion 61 of the diode portion 80, the P− base region 14 is provided to abut on the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ buffer region 20 may be provided below the drift region 18. The doping concentration of the buffer region 20 is higher than the doping concentration of the drift region 18. The buffer region 20 may function as a field stop layer which prevents a depletion layer extending from the lower end of the base region 14 from reaching the P+ collector region 22 and the N+ cathode region 82. The buffer region 20 may have a plurality of peaks in the doping concentration distribution of the depth direction, or may have a single peak.

In the transistor portion 70, the P+ collector region 22 is provided below the buffer region 20. In the diode portion 80, the N+ cathode region 82 is provided below the buffer region 20. The collector region 22 and the cathode region 82 are exposed to the lower surface 23 of the semiconductor substrate 10, and come into contact with the collector electrode 24.

One or more gate trench portions 40 and one or more dummy trench portions 30 are provided on a side near the upper surface 21 of the semiconductor substrate 10. Each trench portion passes through the base region 14 from the upper surface 21 of the semiconductor substrate 10 so as to reach the drift region 18. In the region where at least any one of the emitter region 12, the contact region 15, and the accumulation region 16 is provided, each trench portion passes also through these doping regions and reaches the drift region 18. The passing of the trench portion through the doping region is not limited to a manufacturing order that the doping region is formed and then the trench portion is formed. The configuration that the doping region is formed between the trench portions after the trench portion is formed is also included in the configuration that the trench portion passes through the doping region.

As described above, the gate trench portion 40 and the dummy trench portion 30 are provided in the transistor portion 70. In the diode portion 80, the dummy trench portion 30 is provided, and the gate trench portion 40 is not provided.

The boundary in the X axis direction between the transistor portion 70 and the diode portion 80 in this example is the boundary between the cathode region 82 and the collector region 22. In the example of FIG. 3, the dummy trench portion 30 is disposed at the end in the X axis direction of the transistor portion 70.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding the semiconductor of the inner wall of the gate trench. The gate conductive portion 44 is provided inside the gate dielectric film 42 in the gate trench. In other words, the gate dielectric film 42 insulates the gate conductive portion 44 and the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 in the upper surface 21 of the semiconductor substrate 10. The gate conductive portion 44 is electrically connected to the gate runner. If a predetermined gate voltage is applied to the gate conductive portion 44, a channel caused by an inversion layer of electrons is formed in the surface layer of the boundary abutting on the gate trench portion 40 in the base region 14.

The dummy trench portion 30 may have the same structure as the gate trench portion 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided to cover the inner wall of the dummy trench. The dummy conductive portion 34 is provided in the dummy trench, and provided inside the dummy dielectric film 32. The dummy dielectric film 32 insulates the dummy conductive portion 34 and the semiconductor substrate 10. The dummy conductive portion 34 may be formed of the same material as that of the gate conductive portion 44. For example, the dummy conductive portion 34 is formed of a conductive material such as polysilicon. The dummy conductive portion 34 may have the same length as that of the gate conductive portion 44 in the depth direction. The items characterized as "dummy," for example the dummy trench portion 30 ad the dummy conductive portion 34, may also be characterized herein as "emitter-connected." In other words, the adjective "dummy" may be replaced by "emitter-connected" where appropriate.

The gate trench portion 40 and the dummy trench portion 30 of this example are covered by the interlayer dielectric film 38 in the upper surface 21 of the semiconductor substrate 10. Further, the bottom portions of the dummy trench portion 30 and the gate trench portion 40 may be formed in a curved surface shape (a curved line shape in a cross-sectional view) which is convex downward.

In this specification, a combination of the gate trench portion 40, the emitter region 12 abutting on the gate trench portion 40, and the base region 14 abutting on the gate trench portion 40 is referred to as a gate structure portion 46. The gate structure portion 46 may include only a portion abutting on the gate trench portion 40 among the emitter region 12 and the base region 14 in the mesa portion 60.

The transistor portion 70 includes a plurality of gate structure portions 46 which are arranged in the X axis direction. Each of the gate structure portions 46 has a threshold voltage according to the characteristic of each component. The threshold voltage, also referred to herein simply as the "threshold" in abbreviated form, is a voltage at which a channel is formed in the base region 14 to make the gate structure enter the ON state in a case where the gate voltage is gradually increased. The threshold is determined, for example, according to the doping concentration in the base region 14.

The semiconductor device 100 includes the gate structure portion 46 having a different threshold. In the semiconductor device 100 of this example, there are provided one or more second gate structure portions 46-2 having a second threshold, and one or more first gate structure portions 46-1 having a first threshold smaller than the second threshold. The first threshold is lower than the second threshold by 0.1 V or more and 1 V or less.

In this example, the gate structure portion 46 with a shortest distance to the cathode region 82 in a top view is the first gate structure portion 46-1 having the first threshold. The plurality of gate structure portions 46 sequentially selected from the one with a shortest distance to the cathode region 82 may be the first gate structure portion 46-1. In other words, the transistor portion 70 includes the first gate structure portion 46-1 in the boundary portion with respect to the diode portion 80. In the example of FIG. 3, two gate structure portions 46 with a short distance to the cathode region 82 are the first gate structure portions 46-1. In this example, the distance from the cathode region 82 indicates a distance in the X axis direction.

In addition, the gate structure portion 46 with a longest distance to the cathode region 82 is the second gate structure portion 46-2 having the second threshold. The gate structure portions 46 other than the first gate structure portion 46-1 may be all the second gate structure portions 46-2.

In the boundary portion between the transistor portion 70 and the diode portion 80, an NPN transistor is formed by the emitter region 12, the base region 14, and the cathode region 82. Therefore, even if a collector-emitter voltage is applied to make the transistor portion 70 enter the ON state, the current is linearly increased with respect to the applied voltage in the boundary portion. If the applied voltage reaches a voltage exceeding a built-in voltage of the PN junction near the collector region 22, the state becomes a conductivity modulation state. In particular, if the width of the X axis direction of the transistor portion 70 is miniaturized, the ratio of the boundary portion is increased, and the ratio of the current flowing to the NPN transistor is increased. Therefore, the transistor portion 70 does not enter the ON state until the applied voltage becomes a high voltage, the voltage is steeply reduced when the transistor portion 70 enters the ON state, and the current is increased to cause a snapback phenomenon. In addition, even if the snapback phenomenon does not occur, the conductivity modulation is limited. Therefore, the ON voltage is increased, and a turn-on loss is increased.

According to the semiconductor device 100 of this example, the first gate structure portion 46-1 having a low threshold is disposed in the boundary portion with respect to the diode portion 80 in the transistor portion 70. At the time of turning on the transistor portion 70, the first gate structure portion 46-1 having a low threshold enters the ON state rapidly than the second gate structure portion 46-2. Therefore, the electrons are rapidly supplied from the first gate structure portion 46-1 in the boundary portion, and the PN junction near the collector region 22 operates rapidly. Therefore, the conductivity modulation can be accelerated. In addition, the snapback phenomenon can be suppressed.

Figure 4A:
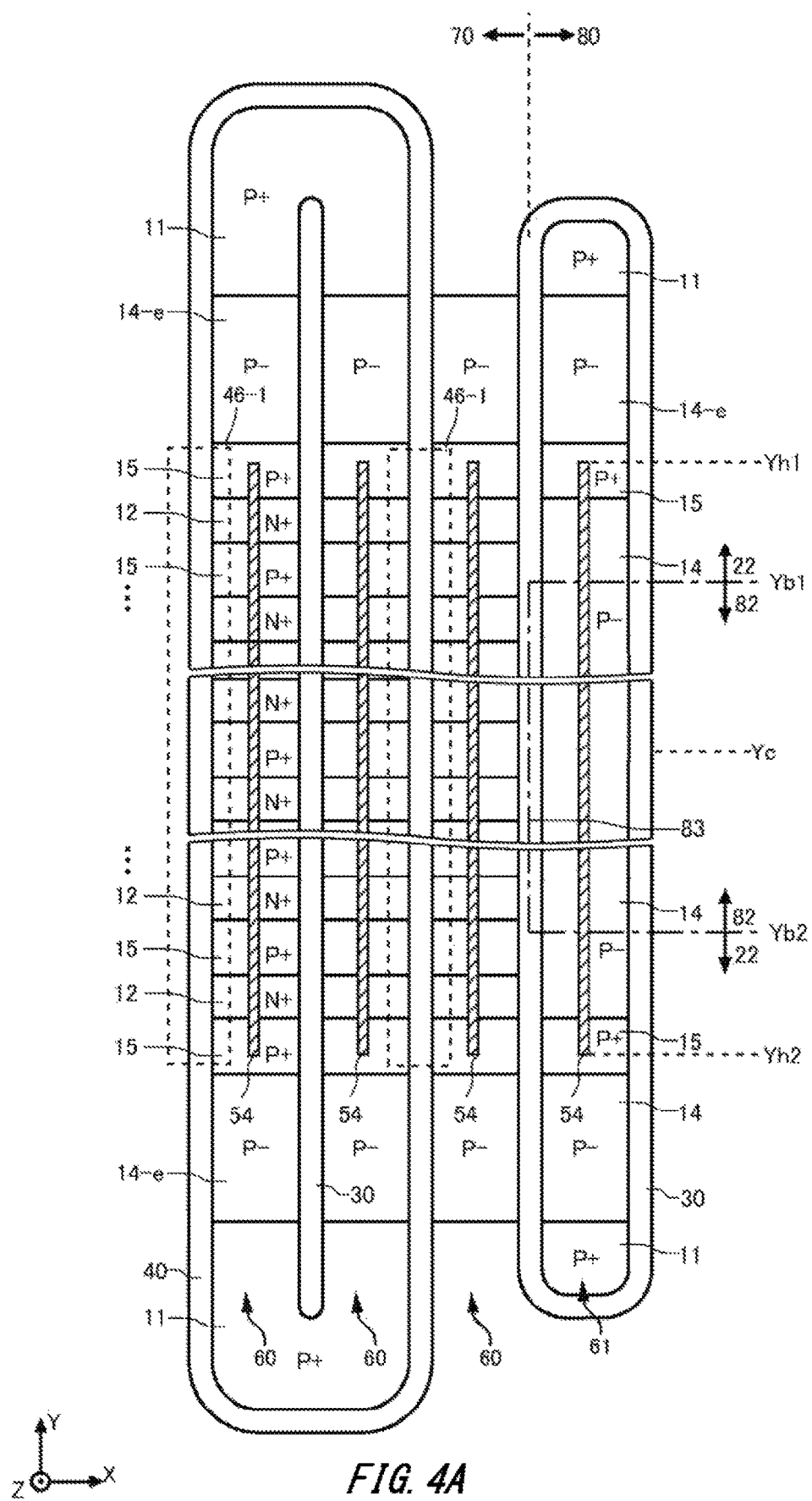
FIG. 4A is a diagram illustrating an arrangement example of a first gate structure portion 46-1 in a top view.

FIG. 4A is a diagram illustrating an arrangement example of the first gate structure portion 46-1 in a top view. In FIG. 4A, the vicinity of the boundary between the transistor portion 70 and the diode portion 80 is illustrated on a magnified scale. In a top view, the cathode region 82 may be a rectangular shape which is long in the Y axis direction. In this example, a long side 83 in the end sides of the cathode region 82 is illustrated. In addition, the positions of both ends in the Y axis direction of the cathode region 82 are referred to as Yb1 and Yb2, and the position of the center is referred to as Yc. In addition, the positions of both ends in the Y axis direction of the contact hole 54 are referred to as Yh1 and Yh2.

The first gate structure portion 46-1 may be provided in parallel with the end side of the cathode region 82 in a top view. The first gate structure portion 46-1 of this example is provided in parallel with the long side 83 of the cathode region 82. The direction where the first gate structure portion 46-1 is provided is a direction where the gate trench portion 40 has a longitudinal side. In addition, the gate mesa portion (the mesa portion 60 in this example) is provided along the longitudinal direction of the gate trench portion 40. In other words, the longitudinal direction of the gate mesa portion and the longitudinal direction of the gate trench portion 40 are the same. The direction where the gate trench portion 40 has a longitudinal side is a direction where the straight portion 39 of the gate trench portion 40 extends, and is the Y axis direction in FIG. 4A. Further, the region where the contact region 15 abutting on the emitter region 12 in the Y axis direction is provided is also included in the first gate structure portion 46-1.

As described above, the first gate structure portion 46-1 is provided in one or more gate mesa portions with a shortest distance to the cathode region 82 among the plurality of gate mesa portions (the mesa portion 60 in this example). The first gate structure portion 46-1 of this example may be provided over two or more emitter regions 12 which are disposed periodically in the Y axis direction. The first gate structure portion 46-1 may be provided in a range, which includes a center position Yc, in the Y axis direction. The first gate structure portion 46-1 may be provided in a wider range than the cathode region 82 in the Y axis direction. In other words, the first gate structure portion 46-1 may be provided outside the end positions Yb1 and Yb2 of the cathode region 82 in the Y axis direction. The outside indicates a side away from the center position Yc. The first gate structure portion 46-1 may be provided inside the end positions Yh1 and Yh2 of the contact hole 54 in the Y axis direction. The inside indicates a side near the center position Yc. The first gate structure portion 46-1 may be provided outside the end positions Yh1 and Yh2 of the contact hole 54 in the Y axis direction. The first gate structure portion 46-1 may be provided over the entire emitter region 12 of the gate mesa portion. The first gate structure portion 46-1 may be provided over the entire contact region 15 of the gate mesa portion. The first gate structure portion 46-1 may be provided over the entire range of the Y axis direction of the mesa portion 60.

Figure 4B:
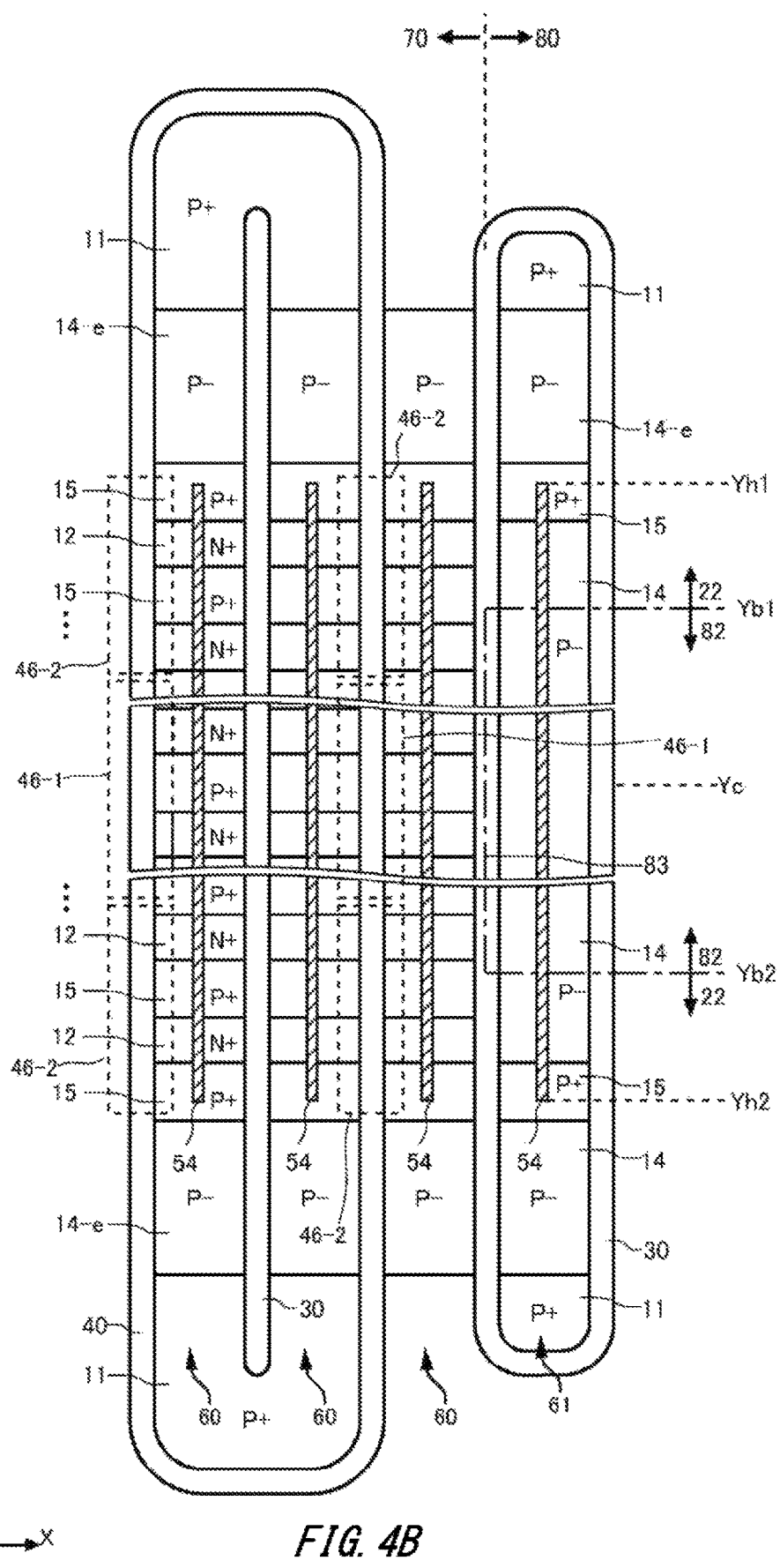
FIG. 4B is a diagram illustrating another arrangement example of the first gate structure portion 46-1 in a top view.

FIG. 4B is a diagram illustrating another arrangement example of the first gate structure portion 46-1 in a top view. The first gate structure portion 46-1 of this example is provided at a position facing the center position Yc of the cathode region 82 in the X axis direction. In other words, the first gate structure portion 46-1 is provided in the range, which includes the center position Yc, in the Y axis direction. However, the first gate structure portion 46-1 of this example is not provided at a position facing the end positions Yb1 and Yb2 of the long side 83 of the cathode region 82 in the X axis direction. In other words, the first gate structure portion 46-1 is provided in the region between the end positions Yb1 and Yb2 in the Y axis direction. The first gate structure portion 46-1 may be not provided in the outermost emitter region 12 among the emitter regions 12 disposed between the end positions Yb1 and Yb2 in the Y axis direction.

In the mesa portion 60, the second gate structure portion 46-2 may be provided in a region other than the first gate structure portion 46-1. The second gate structure portion 46-2 may be provided inside the end positions Yh1 and Yh2 of the contact hole 54 in the Y axis direction. The second gate structure portion 46-2 may be provided outside the end positions Yh1 and Yh2 of the contact hole 54 in the Y axis direction.

If the threshold of the gate structure portion 46 is low, avalanche breakdown easily occurs on a side near a lower surface 23 of the semiconductor substrate 10. In the active portion 120, the carriers may flow in from the outside of the active portion 120. Therefore, the avalanche breakdown is relatively easy to occur in the end portion of the active portion 120. With this regard, the first gate structure portion 46-1 is not provided in the outside portion of the mesa portion 60, so that the avalanche breakdown in that portion can be suppressed. On the other hand, the first gate structure portion 46-1 is provided in the center portion of the mesa portion 60, so that the conductivity modulation can be accelerated.

Figure 5:
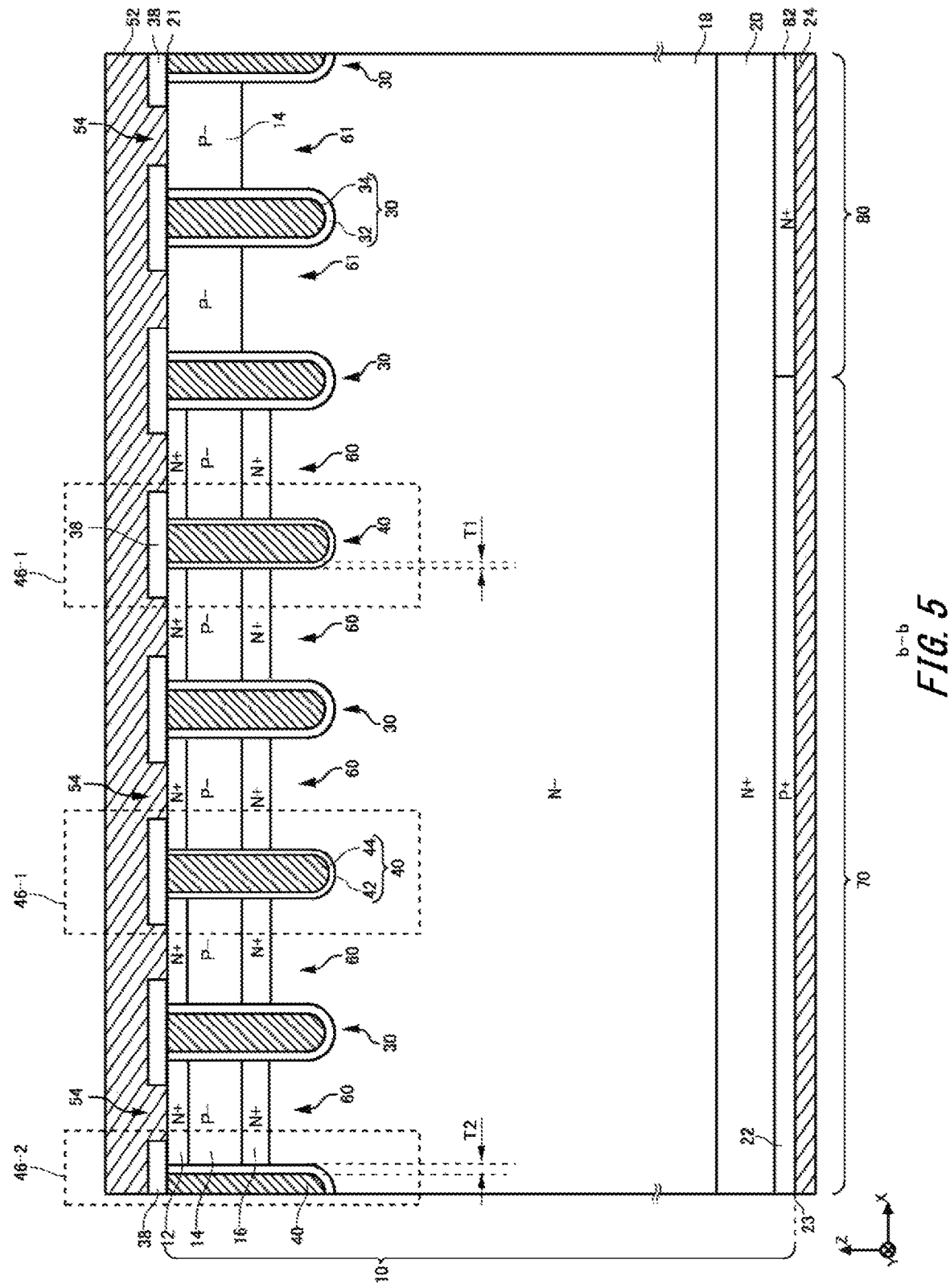
FIG. 5 is a diagram for describing an example of the first gate structure portion 46-1.

FIG. 5 is a diagram for describing an example of the first gate structure portion 46-1. The first gate structure portion 46-1 of this example is configured such that a film thickness T1 of the gate dielectric film 42 is smaller than a film thickness T2 of the gate dielectric film 42 of the second gate structure portion 46-2. As the film thickness of the gate dielectric film 42, the film thickness of the X axis direction which is at the center position of the gate trench portion 40 in the depth direction (Z axis direction) may be used. The film thickness T1 may be set within a range smaller than the thickness of the film thickness T2 and larger than the thickness by about 80% of the film thickness T2, and preferably within a range from 99% to 84% of the film thickness T2. With this configuration, the first threshold of the first gate structure portion 46-1 becomes smaller than the second threshold of the second gate structure portion 46-2.

The gate dielectric film 42 of the first gate structure portion 46-1 and the gate dielectric film 42 of the second gate structure portion 46-2 are formed in different procedures and conditions, so that the film thicknesses may be made different. Further, as illustrated in FIG. 4B, in a case where the first gate structure portion 46-1 and the second gate structure portion 46-2 are provided in one straight portion 39 of the gate trench portion 40, the film thickness of the gate dielectric film 42 in the one straight portion 39 may be changed.

Figure 6:
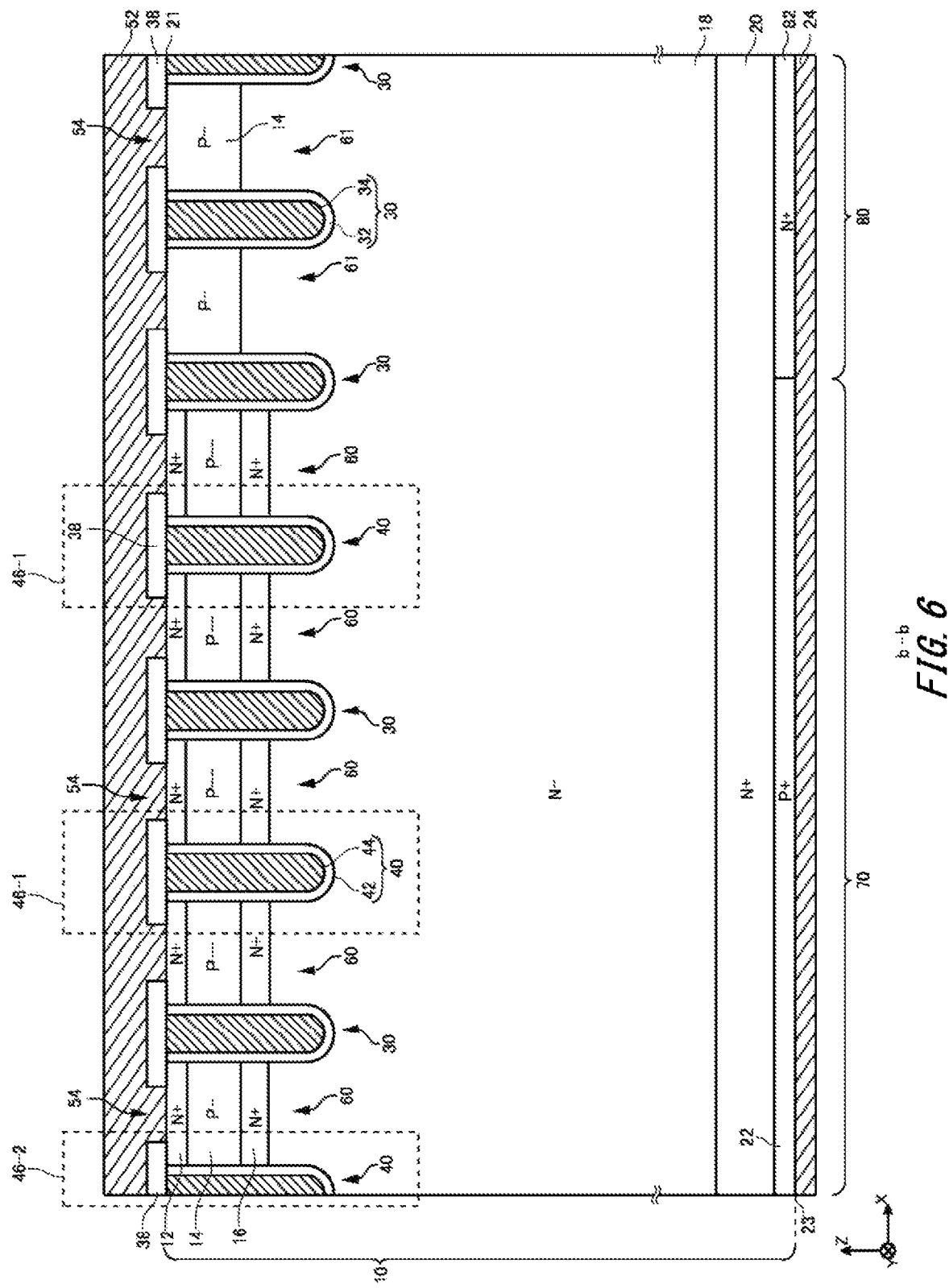
FIG. 6 is a diagram for describing another example of the first gate structure portion 46-1.

FIG. 6 is a diagram for describing another example of the first gate structure portion 46-1. The first gate structure portion 46-1 of this example is configured such that the doping concentration (P-- type in FIG. 6) of the base region 14 is lower than the doping concentration of the base region 14 of the second gate structure portion 46-2. The doping concentration of the base region 14 of the first gate structure portion 46-1 may be set within a range lower than the doping concentration of the base region 14 of the second gate structure portion 46-2, and higher than the doping concentration by about 70% of the doping concentration of the base region 14 of the second gate structure portion 46-2. With this configuration, the first threshold of the first gate structure portion 46-1 becomes smaller than the second threshold of the second gate structure portion 46-2.

The base region 14 of the first gate structure portion 46-1 and the base region 14 of the second gate structure portion 46-2 are formed in different procedures and conditions, so that the doping concentrations may be made different. Further, as illustrated in FIG. 4B, in a case where the first gate structure portion 46-1 and the second gate structure portion 46-2 are provided in one straight portion 39 of the gate trench portion 40, the doping concentration of the base region 14 in one mesa portion 60 may be changed.

Further, the doping concentration of at least one base region 14 of the diode portion 80 may be the same as the doping concentration of the base region 14 of the first gate structure portion 46-1. For example, one or more mesa portions 61 sequentially selected from the one with a short distance to the transistor portion 70 among the mesa portions 61 of the diode portion 80 may be configured such that the doping concentration of the base region 14 is the same as that of the base region 14 of the first gate structure portion 46-1.

Figure 7:
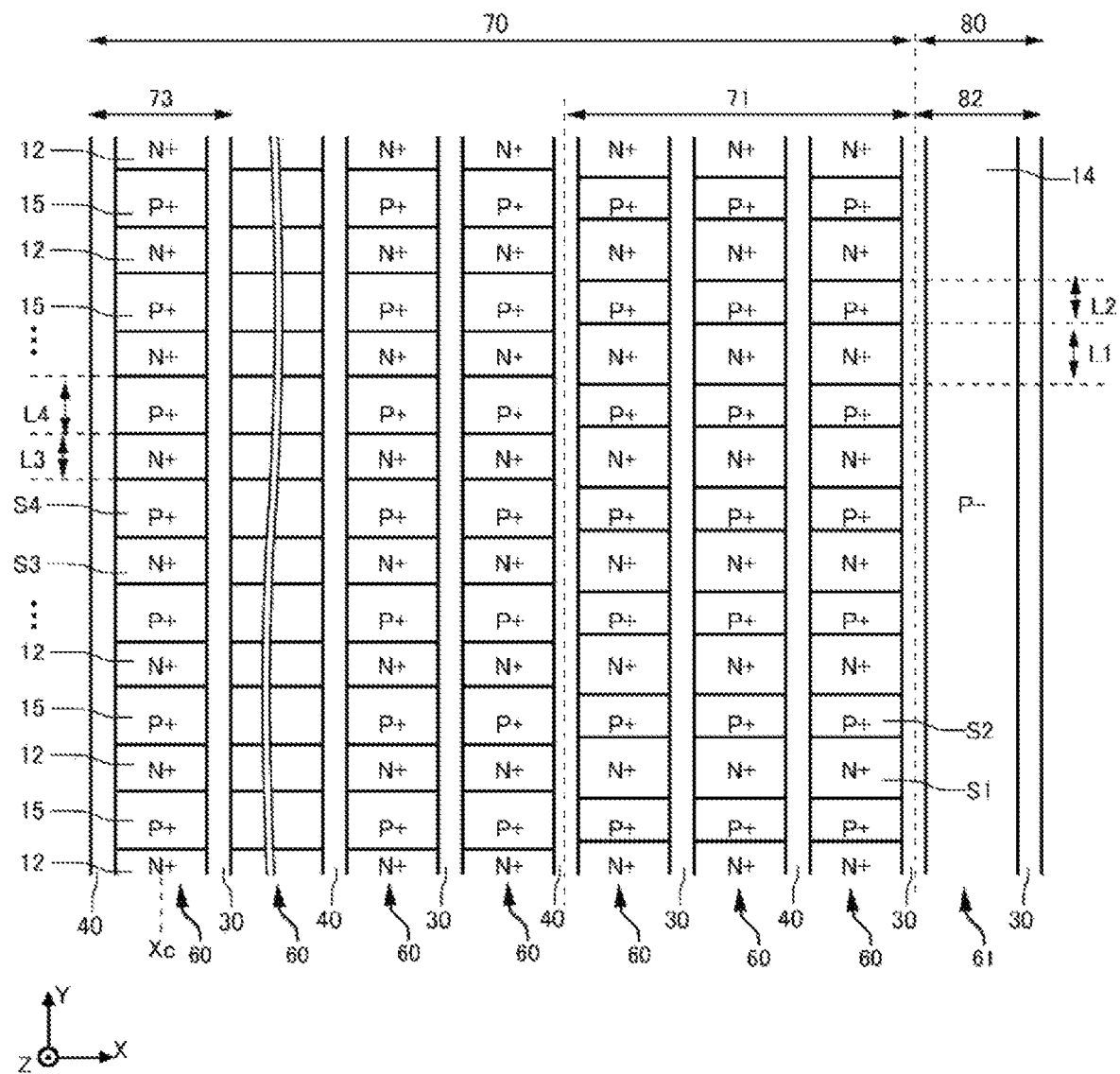
FIG. 7 is a diagram illustrating an arrangement example of doping regions in the upper surface of a mesa portion 60.

FIG. 7 is a diagram illustrating an arrangement example of the doping regions in the upper surface of the mesa portion 60. In this example, the region within a predetermined distance from the diode portion 80 in the X axis direction in the transistor portion 70 is referred to as a proximity region 71. In addition, the center position in the X axis direction of the transistor portion 70 is indicated by Xc, and the region of the transistor portion 70 including the center position Xc is referred to as a center region 73. The center position Xc is a position farthest from the diode portion 80. In the proximity region 71, a plurality of mesa portions 60 may be included. The gate structure portion 46 included in the proximity region 71 is referred to as the first gate structure portion 46-1, and the gate structure portion 46 in the center region 73 other than the proximity region 71 is referred to as the second gate structure portion 46-2.

In this example, a channel density of the gate mesa portion (the mesa portion 60 in this example) in the proximity region 71 is higher than that of the gate mesa portion in the center region 73. The channel density is a ratio of the channel included in a unit area in a top view. In this example, a ratio of the area of the emitter region 12 included in the mesa portion 60 and the area other than the emitter region 12 may be set as the channel density. The area of the emitter region 12 of the mesa portion 60 in the proximity region 71 is indicated by S1, the area of the region (the contact region 15 in this example) other than the emitter region 12 is indicated by S2, the area of the emitter region 12 of the mesa portion 60 in the center region 73 is indicated by S3, and the area of the region other than the emitter region 12 is indicated by S4.

In this example, the area ratio S1/(S1+S2) is higher than the area ratio S3/(S3+S4). The area ratio S1/(S1+S2) may be more than 1.5 times higher, or more than two times higher, than the area ratio S3/(S3+S4). As the channel density (the area ratio S1/(S1+S2) in this example) is increased, the threshold of the gate structure portion 46 becomes small. With this configuration, the first threshold of the first gate structure portion 46-1 included in the proximity region 71 becomes smaller than the second threshold of the second gate structure portion 46-2 included in the center region 73.

In addition, a ratio of the length of the emitter region 12 included in the mesa portion 60 and the length of the region other than the emitter region 12 in the Y axis direction may be set as the channel density. The length of the emitter region 12 of the mesa portion 60 in the proximity region 71 is indicated by L1, the length of the region (the contact region 15 in this example) other than the emitter region 12 is indicated by L2, the length of the emitter region 12 of the mesa portion 60 in the center region 73 is indicated by L3, and the length of the region other than the emitter region 12 is indicated by L4. The channel density L1/(L1+L2) is higher than the channel density L3/(L3+L4). The channel density L1/(L1+L2) may be more than 1.5 times higher, or more than two times higher, than the channel density L3/(L3+L4).

Figure 8:
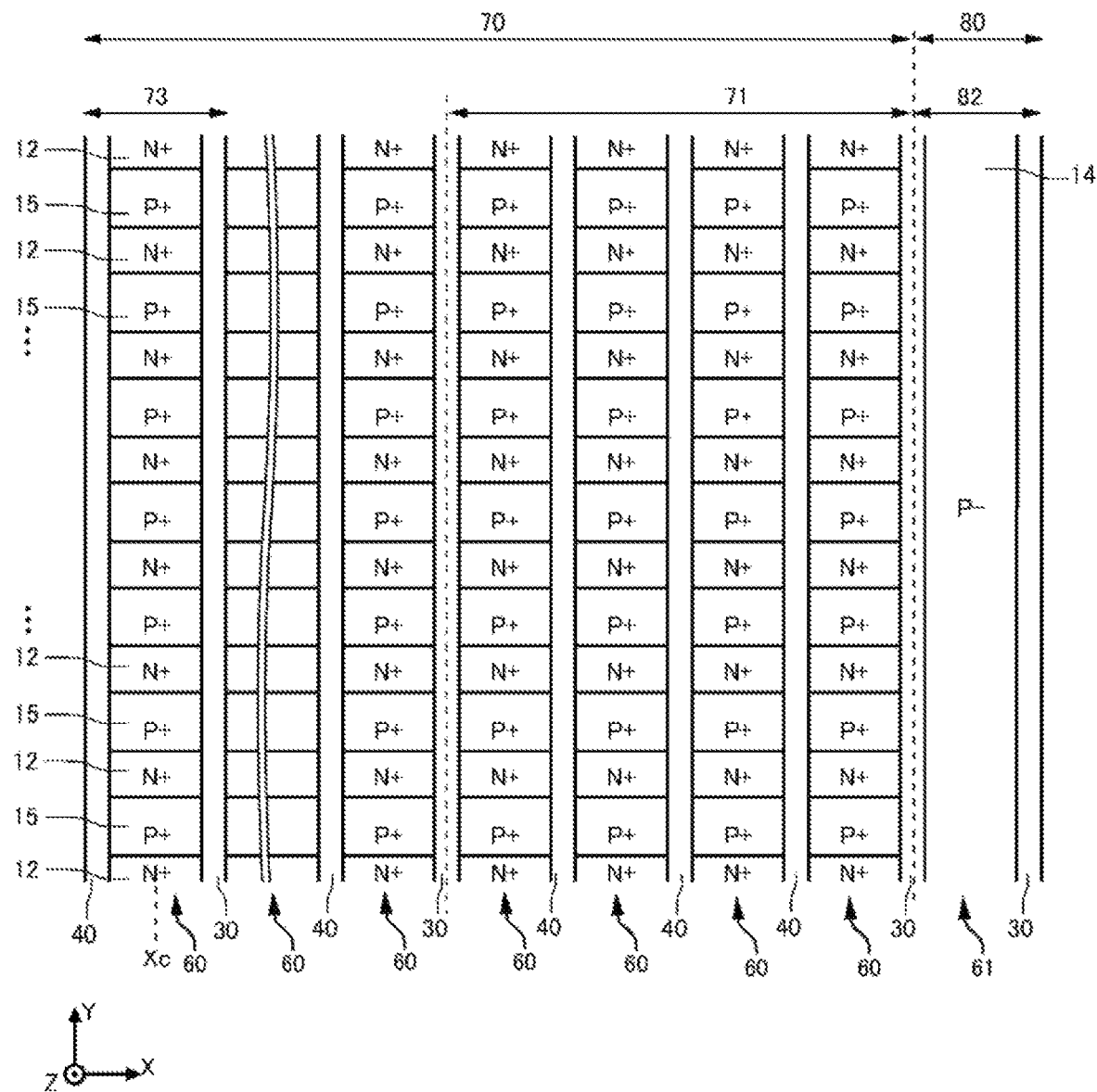
FIG. 8 is a diagram illustrating an arrangement example of trench portions in the upper surface of a transistor portion 70.

FIG. 8 is a diagram illustrating an arrangement example of the trench portions in the upper surface of the transistor portion 70. The transistor portion 70 of this example includes the proximity region 71 and the center region 73 similarly to the example of FIG. 7. The channel density in the proximity region 71 is higher than that in the center region 73.

In this example, the density of the dummy trench portion 30 in the proximity region 71 is lower than that of the dummy trench portion 30 in the center region 73. In other words, the density of the gate trench portion 40 in the proximity region 71 is higher than that of the gate trench portion 40 in the center region 73. The density of the trench portion is the number of trench portions which are included in a unit width in the X axis direction. In this example, the straight portion of each trench portion is referred to as one trench portion. In the example of FIG. 8, the gate trench portion 40 and the dummy trench portion 30 are disposed alternately in the X axis direction in the region other than the proximity region 71. With this regard, in the proximity region 71, two or more gate trench portions 40 are arranged continuously in the X axis direction. With this configuration, the first threshold of the first gate structure portion 46-1 included in the proximity region 71 becomes smaller than the second threshold of the second gate structure portion 46-2 included in the center region 73.

Figure 9:
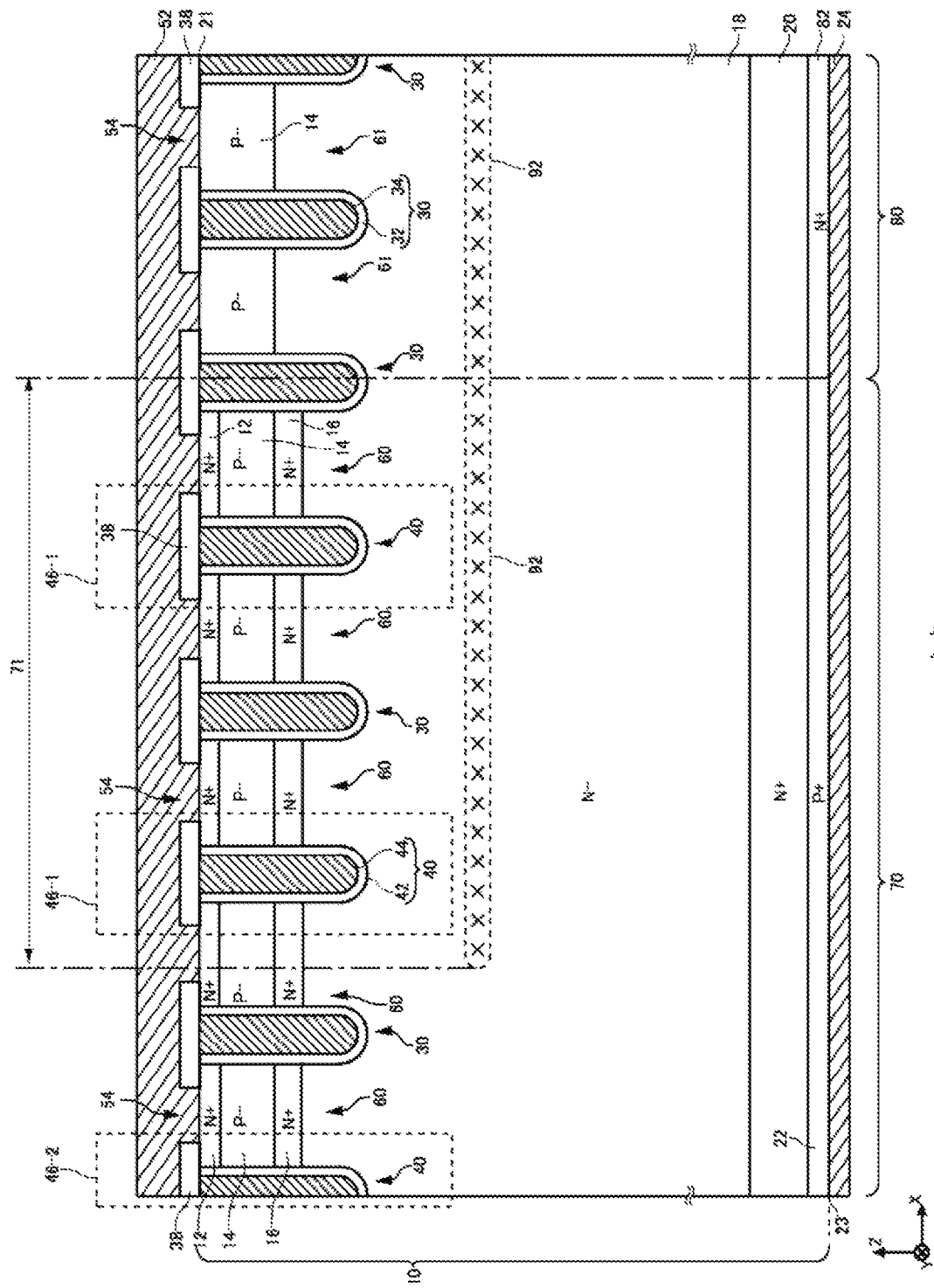
FIG. 9 is a diagram illustrating another example of the cross section taken along line b-b.

FIG. 9 is a diagram illustrating another example of the cross section taken along line b-b. The semiconductor device 100 of this example includes an upper surface side lifetime control region 92 in addition of the configuration of the semiconductor device 100 illustrated in FIG. 3. The other configurations are similar to those of the semiconductor device 100 illustrated in FIG. 3. In addition, even in this example, the semiconductor device 100 includes the proximity region 71.

The upper surface side lifetime control region 92 is a region which is formed by implanting impurities such as light ions from the upper surface 21 side of the semiconductor substrate 10. The impurities are for example, helium ions or hydrogen ions such as protons. A crystal defect is formed in the upper surface side lifetime control region 92 by the implantation of impurities, and the carrier lifetime is lower than other regions due to the crystal defect.

In FIG. 9, the peak positions of distribution in the depth direction of the crystal defect and the carrier lifetime are marked with X. The distribution has a slope with respect to a side near the lower surface 23 side and the upper surface 21 side from the X marks. In a case where the impurities are implanted from a side near the upper surface 21, the crystal defect is formed even in the passing region of the impurities. Therefore, the slope on a side near the upper surface 21 of the distribution of the crystal defect and the carrier lifetime becomes smoother than the slope on a side near the lower surface 23. It is possible to determine whether the upper surface side lifetime control region 92 is formed by implanting the impurities from a side near the upper surface 21 on the basis of the inclination of the slope of the distribution. The upper surface side lifetime control region 92 may be provided on a side near the upper surface 21 from the center in the depth direction of the semiconductor substrate 10.

The diode portion 80 includes the upper surface side lifetime control region 92. The upper surface side lifetime control region 92 may be provided over the entire range in the X axis direction of the diode portion 80. With the upper surface side lifetime control region 92 in the diode portion 80, it is possible to shorten a reverse recovery time of the diode portion 80 to reduce a reverse recovery loss.

The upper surface side lifetime control region 92 is provided to extend to the proximity region 71 of the transistor portion 70. In other words, the upper surface side lifetime control region 92 is provided continuously from the diode portion 80 to the proximity region 71. In this example, in the transistor portion 70, the region where the upper surface side lifetime control region 92 is provided is referred to as the proximity region 71.

As described above, if the impurities are implanted from a side near the upper surface 21 of the semiconductor substrate 10, a crystal defect is formed even in the region where the impurities pass through. Therefore, a crystal defect is formed even in a portion which functions as a channel in the base region 14 of the proximity region 71. If the density of the crystal defects of the channel portion is increased, the threshold of the gate structure portion 46 is lowered. With this configuration, the first threshold of the first gate structure portion 46-1 included in the proximity region 71 becomes smaller than the second threshold of the second gate structure portion 46-2 included in the other regions. Further, in the upper surface side lifetime control region 92, the implantation of impurities is not limited to the implantation from the upper surface side, but the implantation of highly-accelerated light element ions may be performed up to the region near the trench from the lower surface side. Even in this case, the first threshold of the gate structure portion 46-1 can be made smaller than the second threshold of the second gate structure portion 46-2 included in the other region by the influence of the skirt of peak. Further, each of the examples described in FIGS. 4A to 9 may be combined with the other examples. Three or more examples may be combined.

Figure 10:
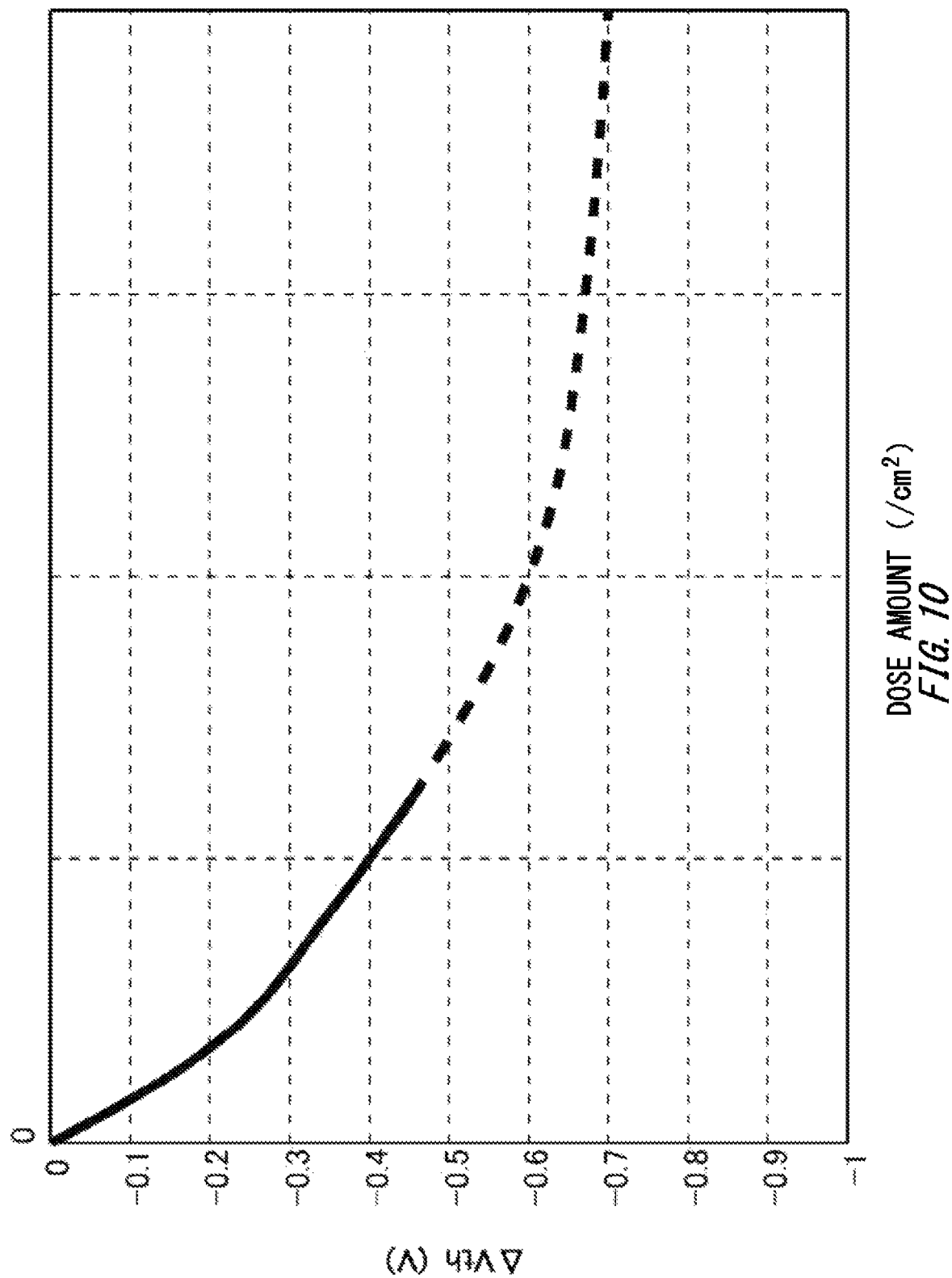
FIG. 10 is a diagram illustrating an example of a dose amount of impurities and a drop amount ΔVth of a threshold voltage in the first gate structure portion 46-1.

FIG. 10 illustrates an example of a dose amount of the impurities implanted to form the upper surface side lifetime control region 92, and a drop amount $\Delta$Vth of a threshold voltage in the first gate structure portion 46-1. The drop amount $\Delta$Vth corresponds to a difference between the second threshold and the first threshold. In this example, the impurities are helium ions. The solid line portion in FIG. 10 represents an actual measurement value, and the dotted line portion represents a calculation value. Further, in an example where the upper surface side lifetime control region 92 is not provided, the threshold of the gate structure portion 46 is 6 V or more and 6.5 V or less.

In this example, the gate voltage is gradually increased from 0 V in a state where 20 V is applied between the emitter and the collector. The gate voltage when a current of 1/1000 of the rated current flows is measured as a threshold. Further, the current flowing to the entire semiconductor device 100 is measured, but as described above the current rapidly starts to flow to the first gate structure portion 46-1 having a threshold lower than the other region. Therefore, the gate voltage when a current of 1/1000 of the rated current flows can be considered as the threshold voltage of the first gate structure portion 46-1.

As illustrated in FIG. 10, the first threshold of the first gate structure portion 46-1 can be controlled by the dose amount of impurities. Further, the drop amount $\Delta$Vth of the threshold voltage varies even according to a diffusion range of impurities (the depth position of the upper surface side lifetime control region 92).

Figure 11:
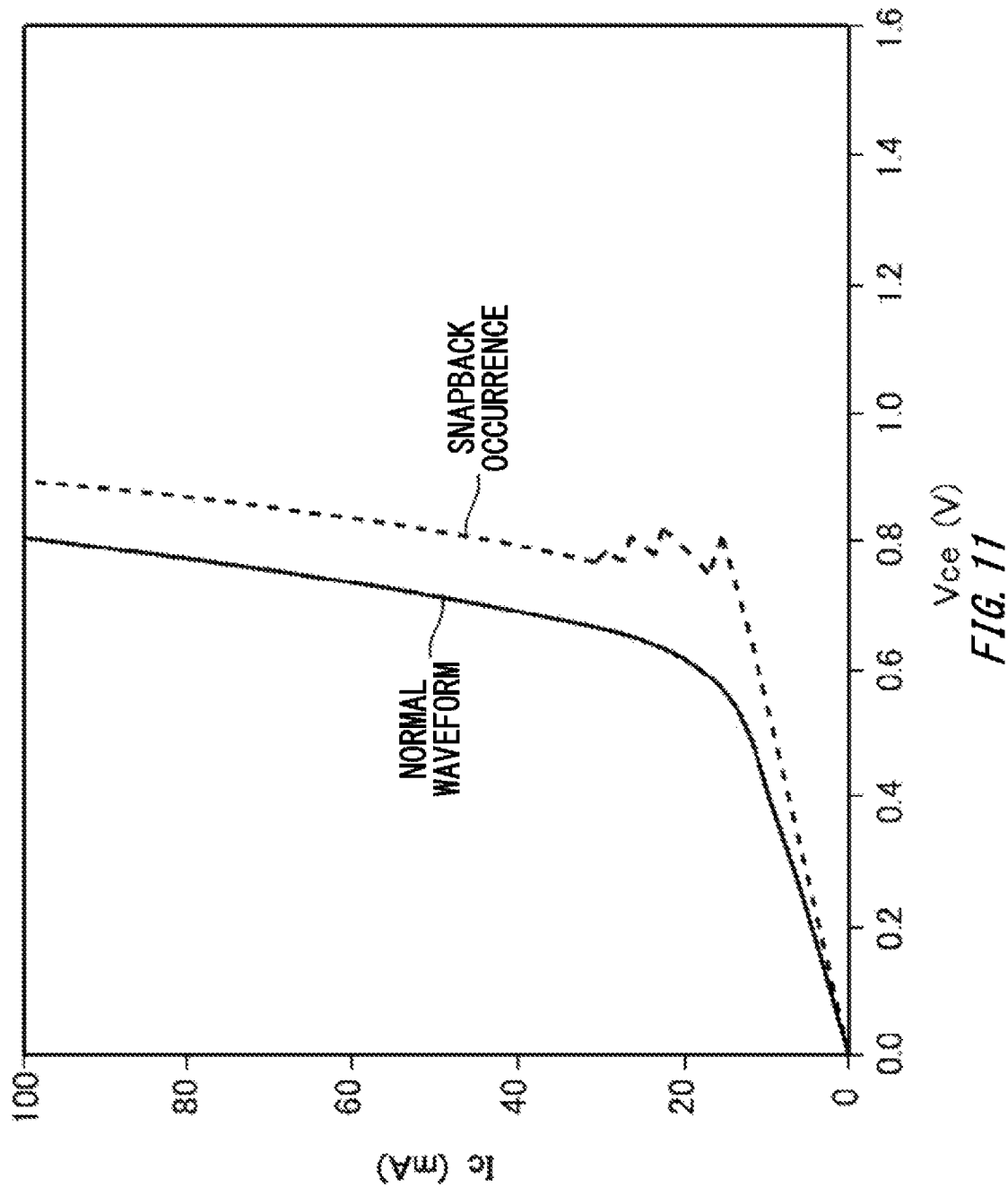
FIG. 11 is a diagram for describing a snapback phenomenon.

FIG. 11 is a diagram for describing the snapback phenomenon. FIG. 11 illustrates a collector current Ic in a case where an emitter-collector voltage Vce is gradually increased. In a normal waveform where no snapback phenomenon occurs, the current mainly flows to the NPN transistor if the voltage Vce starts to increase. Further, if the voltage Vce is increased, the transistor portion 70 operates as an IGBT by the conductivity modulation. With this regard, if the snapback phenomenon occurs, the transistor portion 70 does not enter the ON state until the voltage Vce becomes a high voltage, and the current steeply increases when the transistor portion 70 enters the ON state.

FIG. 12 is a diagram illustrating a relation between the drop amount $\Delta$Vth of the threshold voltage in the first gate structure portion 46-1 and a dynamic characteristic of the semiconductor device 100. In FIG. 12, whether a snapback suppression effect is achieved, and whether a stable operation is achieved are evaluated as the dynamic characteristic of the semiconductor device 100. A case where the snapback suppression effect is achieved is marked with O. In addition, a case where the semiconductor device 100 operates stably is marked with O, a case where the operation is unstable but the semiconductor device 100 is not broken is marked with a triangle, and a case where the semiconductor device 100 is likely to be broken is marked with X.

As illustrated in FIG. 12, ΔVth of the first gate structure portion 46-1 is set to 0.1 V or more, so that the snapback suppression effect is achieved. ΔVth of the first gate structure portion 46-1 may be 0.2 V or more.

On the other hand, if ΔVth is too large, a difference between the threshold voltages in the first gate structure portion 46-1 and the second gate structure portion 46-2 becomes large, and the operation of the semiconductor device 100 may become unstable. For example, the current is locally crowded on the first gate structure portion 46-1 when the transistor portion 70 is turned off. Therefore, there is a possibility that a latch-up withstand capability is lowered. In addition, if the doping concentration of the base region 14 is too lowered, an electrical resistance of the base region 14 is increased, and the latch-up withstand capability is lowered. In addition, if the threshold voltage is set small, the avalanche breakdown easily occurs in the lower surface 23 side when the semiconductor device 100 is short-circuited. In addition, if the crystal defect is excessively formed, a leakage current is increased, and a destruction caused by thermal runaway easily occurs.

As illustrated in FIG. 12, if ΔVth is set to larger than 1.0 V, the destruction of the semiconductor device 100 easily occurs. Therefore, ΔVth of the first gate structure portion 46-1 of this example is 1.0 V or less. More preferably, ΔVth of the first gate structure portion 46-1 is 0.5 V or less. With this configuration, it is possible to make the semiconductor device 100 stably operate while suppressing the snapback phenomenon. ΔVth of the first gate structure portion 46-1 may be 0.3 V or less.

Figure 13:
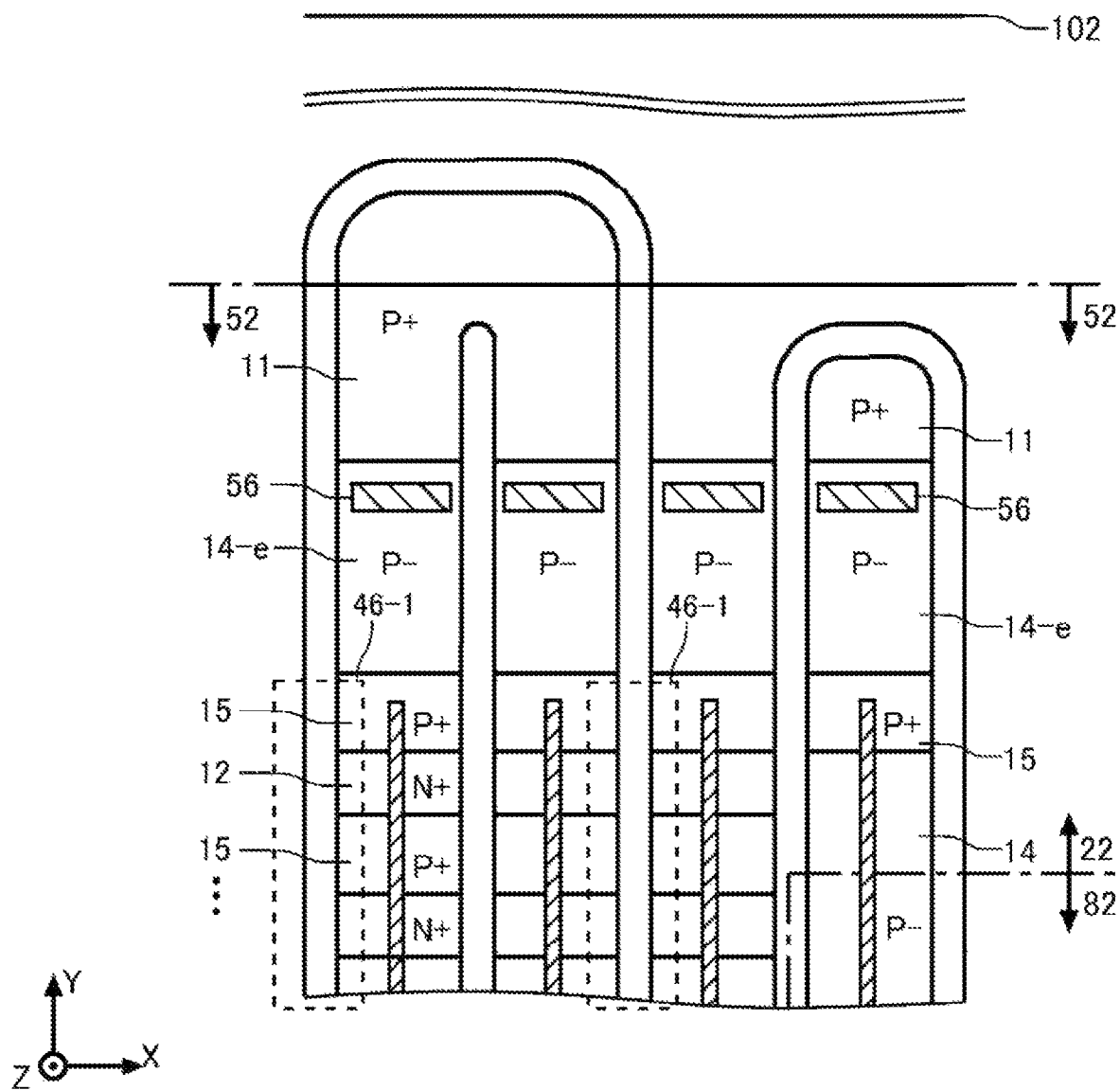
FIG. 13 is a diagram illustrating a configuration example of the upper surface of the semiconductor device 100.

FIG. 13 is a diagram illustrating a configuration example of the upper surface of the semiconductor device 100. The semiconductor device 100 of this example further includes a contact hole 56 for extracting holes. The contact hole 56 is provided between the first gate structure portion 46-1 and the end side 102 of the semiconductor substrate 10 in the Y axis direction. The emitter electrode 52 and the P region of the semiconductor substrate 10 are connected by the contact hole 56. The contact hole 56 of this example is disposed on an upper side of the base region 14-e. However, the contact hole 56 may be disposed on an upper side of the well region 11, may be disposed on an upper side of the other base region 14, or may be disposed on an upper side of the contact region 15.

The contact hole 56 has a longitudinal side in a direction different from the extending direction (Y axis direction) of the gate trench portion 40. The contact hole 56 of this example has a longitudinal side in the X axis direction. With the contact hole 56, holes heading from the outside of the first gate structure portion 46-1 toward the first gate structure portion 46-1 can be extracted before the holes reach the first gate structure portion 46-1. With this configuration, it is possible to suppress that the carriers are concentrated on the first gate structure portion 46-1 having a low threshold.

Figure 14:
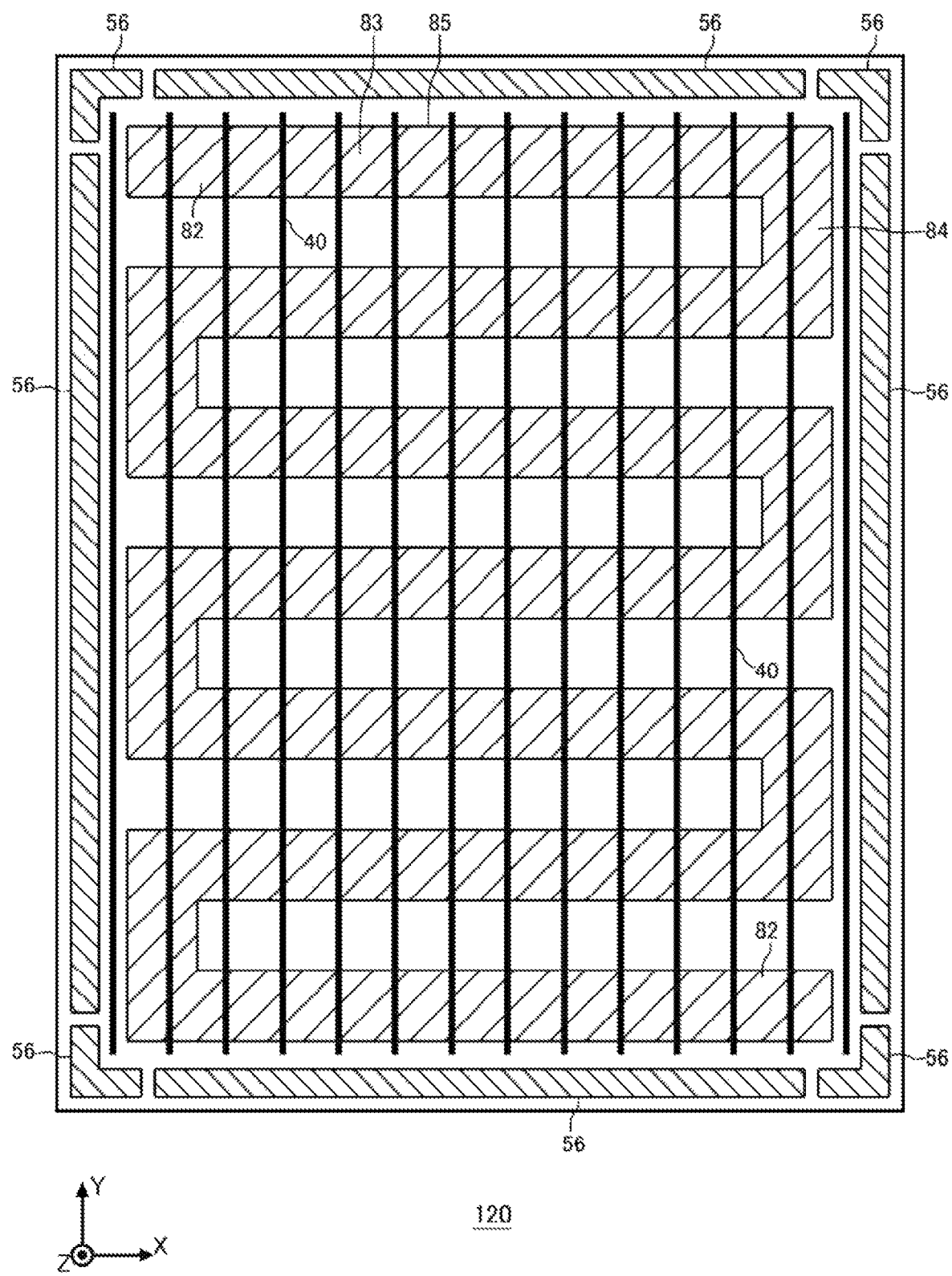
FIG. 14 is a diagram illustrating an arrangement example of a cathode region 82 in the upper surface of an active portion 120.

FIG. 14 is a diagram illustrating an arrangement example of the cathode region 82 in the upper surface of the active portion 120. The cathode region 82 of this example has a long side 85 in a top view. The long side 85 is a side of the longest straight portion among the end sides of the cathode region 82. The gate trench portion 40 of this example intersects with the long side 85 of the cathode region 82 in a top view. The gate trench portion 40 may be perpendicular to the long side 85. In FIG. 14, the gate trench portion 40 is schematically illustrated with a bold line. In addition, the dummy trench portion 30 is omitted.

Even in this example, the gate mesa portion is provided in a region in direct contact with to the gate trench portion 40. In the upper surface of the gate mesa portion, there are provided the emitter region 12 and the contact region 15 which abut on the gate trench portion 40. In other words, the gate structure portion 46 is disposed along the gate trench portion 40.

Even in this example, the first threshold of the first gate structure portion 46-1 closest to the end side of the cathode region 82 is smaller than the second threshold of the second gate structure portion 46-2 farthest to the end side of the cathode region 82. The cathode region 82 may include a plurality of intersections 83 along the Y axis direction, which extend in the X axis direction and intersect with the gate trench portion 40. The gate trench portion 40 may intersect with the plurality of intersections 83.

The cathode region 82 may include a connection portion 84 which connects two adjacent intersections 83. The connection portion 84 may connect the end portions in the X axis direction of the intersection 83. The connection portion 84 is provided to extend in the Y axis direction. The cathode region 82 may be provided to meander in a top view.

The active portion 120 of this example may also include the contact hole 56. The contact hole 56 is disposed between the gate trench portion 40 or the cathode region 82, and the end portion of the active portion 120. The contact hole 56 may be disposed to surround the entire region where the gate trench portion 40 is provided. The contact hole 56 may be disposed discretely along the outer periphery of the region where the gate trench portion 40 is provided.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES 10 semiconductor substrate, 11 well region, 12 emitter region, 14 base region, 15 contact region, 16 accumulation region, 18 drift region, 20 buffer region, 21 upper surface, 22 collector region, 23 lower surface, 24 collector electrode, 29 straight portion, 30 dummy trench portion, 31 edge portion, 32 dummy dielectric film, 34 dummy conductive portion, 38 interlayer dielectric film, 39 straight portion, 40 gate trench portion, 41 edge portion, 42 gate dielectric film, 44 gate conductive portion, 46 gate structure portion, 46-1 first gate structure portion, 46-2 second gate structure portion, 52 emitter electrode, 54 contact hole, 56 contact hole, 60, 61 mesa portion, 70 transistor portion, 71 proximity region, 73 center region, 80 diode portion, 81 extension region, 82 cathode region, 83 intersection, 84 connection portion, 85 long side, 90 edge termination structure, 92 upper surface side lifetime control region, 100 semiconductor device, 102 end side, 112 gate pad, 120 active portion, 130 outer peripheral gate runner, 131 active side gate runner

What is claimed is:

1. A semiconductor device, comprising:
a semiconductor substrate which includes a drift region of a first conductive type;
a transistor portion which includes a plurality of gate structure portions in an upper surface of the semiconductor substrate;
an emitter electrode; and
a diode portion which includes a cathode region of the first conductive type, which has a higher doping concentration than the drift region, in a lower surface of the semiconductor substrate,
wherein each of the gate structure portions includes
a gate trench portion which is provided to reach the drift region from the upper surface of the semiconductor substrate,
an emitter region of the first conductive type which is provided between the upper surface of the semiconductor substrate and the drift region to abut on the gate trench portion and has a higher doping concentration than the drift region, and
a base region of a second conductive type which is provided between the emitter region and the drift region to abut on the gate trench portion,
wherein a first threshold voltage of the gate structure portion with a shortest distance to the cathode region in a top view is lower than a second threshold voltage of the gate structure portion with a longest distance to the cathode region by 0.1 V or more and 1 V or less, and
wherein the gate trench portion of each of the plurality of gate structure portions has a longitudinal direction that is the same for the plurality of gate structure portions, wherein there is a boundary between the transistor portion and the diode portion extending in the longitudinal direction, wherein the semiconductor device further comprises one or more emitter-connected trench portions each of which is conductively connected to the emitter electrode, wherein a boundary trench portion that is one of the one or more emitter-connected trench portions is disposed at the boundary between the transistor portion and the diode portion and extends in the longitudinal direction,
wherein the boundary trench portion has a transistor portion side on which the transistor portion is located, wherein the boundary trench portion has a diode portion side on which the diode portion is located, and wherein the transistor portion side of the boundary trench portion has the emitter region adjacent the boundary trench portion and there is no emitter region provided on the diode portion side of the boundary trench portion adjacent the boundary trench portion.

2. The semiconductor device according to claim 1,
wherein the gate structure portion having the first threshold voltage is provided in parallel with an end side of the cathode region in a top view.

3. The semiconductor device according to claim 1,
wherein the gate trench portion is provided to have a longitudinal side in a direction parallel with an end side of the cathode region,
wherein the transistor portion includes the gate structure portion, and a plurality of gate mesa portions which are provided along the longitudinal side of the gate trench portion, and
wherein the gate structure portion having the first threshold voltage is provided in a gate mesa portion with a shortest distance to the cathode region among the plurality of gate mesa portions.

4. The semiconductor device according to claim 3,
wherein a channel density of the gate mesa portion having the first threshold voltage is higher than the channel density of the gate mesa portion having the second threshold voltage.

5. The semiconductor device according to claim 4,
wherein the gate mesa portion includes the emitter region and a contact region of the second conductive type, which has a higher doping concentration than the base region, in the upper surface of the semiconductor substrate, and
wherein an area ratio of the contact region to the emitter region in an upper surface of the gate mesa portion having the first threshold voltage is smaller than an area ratio of the contact region to the emitter region in the upper surface of the gate mesa portion having the second threshold voltage.

6. The semiconductor device according to claim 1,
wherein the gate trench portion includes
a gate conductive portion, and
a gate dielectric film which is provided between the gate conductive portion and the semiconductor substrate, and
wherein a film thickness of the gate dielectric film in the gate trench portion of the gate structure portion having the first threshold voltage is smaller than a film thickness of the gate dielectric film in the gate trench portion of the gate structure portion having the second threshold voltage.

7. The semiconductor device according to claim 1,
wherein a doping concentration of the base region of the gate structure portion having the first threshold voltage is lower than a doping concentration of the base region of the gate structure portion having the second threshold voltage.

8. The semiconductor device according to claim 1,
wherein the transistor portion includes the gate trench portion and a emitter-connected trench portion,
wherein a density of the gate trench portion in a proximity region of the transistor portion abutting on the cathode region in a top view is higher than a density of the gate trench portion in a center region in a region with a longest distance to the cathode region, and
wherein the gate structure portion having the first threshold voltage is provided in the proximity region.

9. The semiconductor device according to claim 1,
wherein the diode portion includes an upper surface side lifetime control region which has a shorter carrier lifetime than other regions, on an upper surface side of the semiconductor substrate,
wherein the upper surface side lifetime control region is provided to extend to a proximity region of the transistor portion abutting on the cathode region in a top view, and
wherein the gate structure portion having the first threshold voltage is provided in the proximity region.

10. The semiconductor device according to claim 1,
wherein the cathode region has a long side in a top view, and
wherein the gate structure portion having the first threshold voltage is provided at a position facing a center of the long side of the cathode region, and is not provided at a position facing either end of the long side.

11. The semiconductor device according to claim 1,
wherein the cathode region has a long side in a top view, and
wherein the gate trench portion intersects with the long side of the cathode region in a top view.

12. The semiconductor device according to claim 1, further comprising:
an interlayer dielectric film which is provided on an upper side of the upper surface of the semiconductor substrate, and includes a contact hole; and
an emitter electrode which is provided on an upper side of the interlayer dielectric film, and comes into contact with the semiconductor substrate through the contact hole,
wherein the gate trench portion extends in a predetermined extending direction in the upper surface of the semiconductor substrate, and
wherein the contact hole which has a longitudinal side in a direction different from the extending direction is disposed between the gate structure portion having the first threshold voltage and an end side of the semiconductor substrate in the extending direction.

13. The semiconductor device according to claim 1,
wherein the first threshold voltage is lower than the second threshold voltage by 0.1 V or more and 0.5 V or less.

14. The semiconductor device according to claim 1, wherein the one or more emitter-connected trench portions comprise a plurality of emitter-connected trench portions, wherein the plurality of emitter-connected trench portions comprises one or more emitter-connected trench portions disposed in the transistor portion and apart from the boundary between the transistor portion and the diode portion and extending in the longitudinal direction, and wherein one or more gate trench portions of the plurality of gate structure portions and the one or more emitter-connected trench portions, which are disposed in the transistor portion and apart from the boundary between the transistor portion and the diode portion and extend in the longitudinal direction, are alternately provided along a direction perpendicular to the longitudinal direction.

15. The semiconductor device according to claim 1, wherein trench portions are provided in the diode portion and all the trench portions provided in the diode portion are emitter-connected trench portions.

16. The semiconductor device according to claim 1, further comprising a collector region provided in the lower surface of the lower surface of the semiconductor substrate, wherein the boundary between the transistor portion and the diode portion is the boundary between the cathode region and the collector region.

17. A semiconductor device, comprising:
a semiconductor substrate which includes a drift region of a first conductive type;
a transistor portion which includes a plurality of gate structure portions in an upper surface of the semiconductor substrate;
an emitter electrode; and
a diode portion which includes a cathode region of the first conductive type, which has a higher doping concentration than the drift region, in a lower surface of the semiconductor substrate,
wherein each of the gate structure portions includes
a gate trench portion which is provided to reach the drift region from the upper surface of the semiconductor substrate,
an emitter region of the first conductive type which is provided between the upper surface of the semiconductor substrate and the drift region to abut on the gate trench portion and has a higher doping concentration than the drift region, and
a base region of a second conductive type which is provided between the emitter region and the drift region to abut on the gate trench portion,
wherein a first threshold voltage of the gate structure portion with a shortest distance to the cathode region in a top view is lower than a second threshold voltage of the gate structure portion with a longest distance to the cathode region by 0.1 V or more and 1 V or less, and
wherein the gate trench portion of each of the plurality of gate structure portions has a longitudinal direction that is the same for the plurality of gate structure portions, wherein there is a boundary between the transistor portion and the diode portion extending in the longitudinal direction, wherein the semiconductor device further comprises one or more emitter-connected trench portions each of which is conductively connected to the emitter electrode, wherein a boundary trench portion that is one of the one or more emitter-connected trench portions is disposed at the boundary between the transistor portion and the diode portion and extends in the longitudinal direction, and
wherein trench portions are provided in the diode portion and all the trench portions provided in the diode portion are emitter-connected trench portions.

* * * * *